US012813325B2

(12) United States Patent
Min et al.

(10) Patent No.: US 12,813,325 B2
(45) Date of Patent: Nov. 24, 2026

(54) INTERCONNECTOR PACKAGE STRUCTURE

(71) Applicant: Advanced Semiconductor Engineering, Inc., Kaohsiung (TW)

(72) Inventors: Fan-Yu Min, Kaohsiung (TW); Chen-Hung Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 371 days.

(21) Appl. No.: 18/391,567

(22) Filed: Dec. 20, 2023

(65) Prior Publication Data

US 2025/0210433 A1 Jun. 26, 2025

(51) Int. Cl.

*H10W 74/10* (2026.01)
*H10W 70/65* (2026.01)
*H10W 74/47* (2026.01)
*H10W 74/15* (2026.01)
*H10W 90/00* (2026.01)

(52) U.S. Cl.

CPC ....... *H10W 74/121* (2026.01); *H10W 70/657* (2026.01); *H10W 74/473* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

2014/0367841 A1* 12/2014 Huang ................ H10W 74/473 257/692

* cited by examiner

*Primary Examiner* — Kyoung Lee

(74) *Attorney, Agent, or Firm* — Foley & Lardner LLP

(57) ABSTRACT

A package structure includes an interconnector, a first encapsulation layer, a second encapsulation layer. The interconnector includes a lower portion and an upper portion located on the lower portion. The first encapsulation layer encapsulates the lower portion, and has a first top surface adjacent to the upper portion. The first top surface includes a first region and a second region different from the first region. The second encapsulation layer encapsulates the upper portion, and has a second bottom surface and a second top surface. The second bottom surface faces the first top surface. The second top surface is opposite to the second bottom surface. The second top surface includes a third region and a fourth region different from the third region. A first elevation difference between a first elevation of the first region and a second elevation of the second region is greater than a second elevation difference between a third elevation of the third region and a fourth elevation of the fourth region.

20 Claims, 20 Drawing Sheets

INTERCONNECTOR PACKAGE STRUCTURE

BACKGROUND

1. Field of the Disclosure

The present disclosure relates to a package structure, and to a package structure including an encapsulant having at least two layers.

2. Description of the Related Art

In a semiconductor package structure, an encapsulant may be used to encapsulate at least one semiconductor die. A circuit layer may be formed over a surface the encapsulant to electrically connect to the semiconductor die. Thus, the quality of the surface of the encapsulant may affect the quality of the circuit layer. A flatness or smoothness of the surface the encapsulant is a critical issue especially after a thinning process (e.g., grinding process).

SUMMARY

In some embodiments, a package structure includes an interconnector, a first encapsulation layer, a second encapsulation layer. The interconnector includes a lower portion and an upper portion located on the lower portion. The first encapsulation layer encapsulates the lower portion, and has a first top surface adjacent to the upper portion. The first top surface includes a first region and a second region different from the first region. The second encapsulation layer encapsulates the upper portion, and has a second bottom surface and a second top surface. The second bottom surface faces the first top surface. The second top surface is opposite to the second bottom surface. The second top surface includes a third region and a fourth region different from the third region. A first elevation difference between a first elevation of the first region and a second elevation of the second region is greater than a second elevation difference between a third elevation of the third region and a fourth elevation of the fourth region.

In some embodiments, a package structure includes an interconnector, a first encapsulation layer and a second encapsulation layer. The first encapsulation layer encapsulates the interconnector, has a first top surface, and includes a first filler. The second encapsulation layer encapsulates the interconnector, and is disposed over the first encapsulation layer. The second encapsulation layer has second bottom surface and a second top surface. The second bottom surface faces the first top surface. The second top surface is opposite to the second bottom surface. The second encapsulation layer includes a second filler. A diameter of the second filler is less than a diameter of the first filler. An elevation of the second top surface is higher than an elevation of the first top surface. A top surface of the interconnector is substantially aligned with the second top surface.

In some embodiments, a package structure includes a pillar and a first encapsulation layer. The first encapsulation layer includes a plurality of fillers, and encapsulates the pillar. The first encapsulation layer has a first top surface. The pillar includes a first portion and a second portion. The first portion extends beyond the first top surface of the first encapsulation layer. The second portion is embedded in the first encapsulation layer. The fillers are not exposed by the first top surface. The pillar has a top surface higher than the first top surface.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
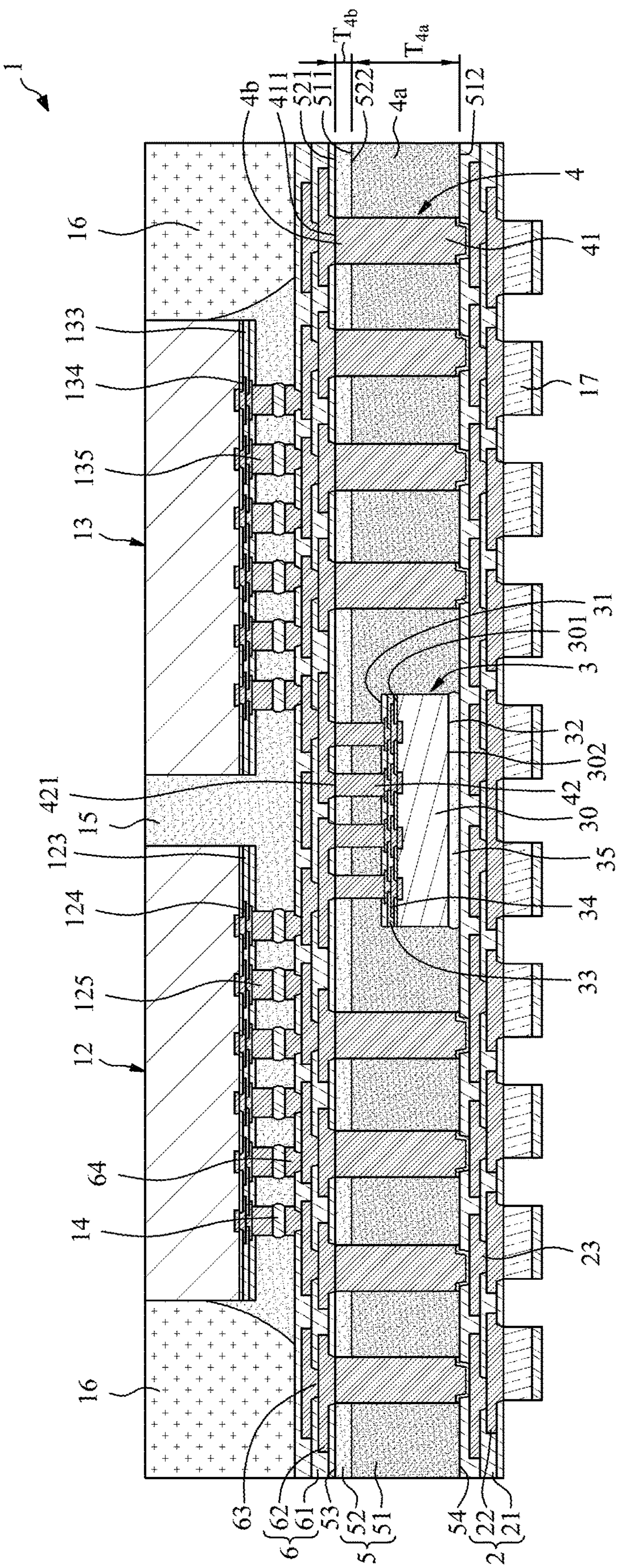
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a package structure 1 according to some embodiments of the present disclosure. The package structure 1 may be an electronic package structure or a semiconductor package structure. The package structure 1 may include a second patterned circuit structure 2, a first electronic device 3, an interconnector 4 (including, for example, at least one pillar 41 and at least one bump 42), an encapsulant 5 (including, for example, a first encapsulation layer 51 and a second encapsulation layer 52), a first patterned circuit structure 6, a second electronic device 12, a third electronic device 13, a plurality of solder materials 14, an underfill 15, a protection material 16 and at least one external connector 17.

The second patterned circuit structure 2 may be a conductive structure, a wiring structure, a stacked structure, a redistribution layer (RDL) structure or a substrate structure. The second patterned circuit structure 2 may be disposed under the encapsulant 5, and may be electrically connected to the first patterned circuit structure 6 through the interconnector 4 (including, for example, the pillar 41). Alternatively, the encapsulant 5 may be built on the second patterned circuit structure 2. The second patterned circuit structure 2 may include at least one dielectric layer 21 and at least one circuit layer 22. The circuit layer 22 may be a patterned redistribution layer, and may be embedded in the dielectric layers 21. As shown in FIG. 1, the second patterned circuit structure 2 includes three dielectric layers 21 and two circuit layers 22. However, the amount of the dielectric layers 21 and the amount of the circuit layers 22 are not limited in the present disclosure. In some embodiments, the circuit layer 22 may include a seed layer 221 and a conductive layer 222 on the seed layer 221. The seed layer 221 may be undercut. Thus, two ends of the conductive layer 222 may extend beyond the seed layer 221 horizontally. However, in other embodiments, the seed layer may be omitted. The circuit layer 22 of the second patterned circuit structure 2 may include at least one inner via 23. The inner vias 23 may have different widths, and may taper downwardly.

The first electronic device 3 may be disposed on the second patterned circuit structure 2. In some embodiments, the first electronic device 3 may be a bridge chip, a bridge die or an interposer. The first electronic device 3 may have a first surface 31 (e.g., a top surface or an active surface) and a second surface 32 (e.g., a bottom surface or a backside surface) opposite to the first surface 31. In some embodiments, the first electronic device 3 may be adapted for signal transmission between two electronic devices (e.g., the second electronic device 12 and the third electronic device 13) electrically connected to the first electronic device 3.

The first electronic device 3 may include a main body 30, at least one dielectric layer 33 and at least one circuit layer 34. The main body 30 may have a first surface 301 (e.g., a top surface) and a second surface 302 (e.g., a bottom surface) opposite to the first surface 301. The first surface 301 of the main body 30 may face the second electronic device 12, or the third electronic device 13. The main body 30 may include an inorganic material. The main body 30 may include a ceramic material, silicon material or glass. The dielectric layer 33 and the circuit layer 34 may be disposed on or disposed over the first surface 301 of the main body 30. The circuit layer 34 may be a patterned circuit layer, and may be embedded in the dielectric layers 33. The circuit layer 34 may be a back end of line (BEOL). The amount of the dielectric layers 33 and the amount of the circuit layers 34 are not limited in the present disclosure. In some embodiments, the circuit layer 34 may include a seed layer and a conductive layer on the seed layer. However, in other embodiments, the seed layer may be omitted. The circuit layer 34 of the first electronic device 3 may include at least one inner via tapering downwardly. The circuit layer 34 may be adapted for signal transmission between the two electronic devices (e.g., the second electronic device 12 and the third electronic device 13).

The second surface 302 (e.g., the bottom surface) of the main body 30 may be the second surface 32 (e.g., the bottom surface) of the first electronic device 3, and may be attached to or adhered to the second patterned circuit structure 2 through an adhesion layer 35. Thus, the second surface 302 of the main body 30 (i.e., the second surface 32 of the first electronic device 3) may be not electrically connected to the second patterned circuit structure 2, and there may be no electrical path between the second surface 302 of the main body 30 (i.e., the second surface 32 of the first electronic device 3) and the second patterned circuit structure 2.

The interconnector 4 may include a plurality of pillars 41 and a plurality of bumps 42. The interconnector 4 may be also referred to "a pillar", "a stud" or "a bump". The interconnector 4 (including the pillars 41 and the bumps 42) may include a lower portion **4*a* (e.g., a second portion 4*a*) and an upper portion 4*b* (e.g., a first portion 4*b*) located on the lower portion 4*a*. The lower portion 4*a* may be disposed in a first encapsulation layer 51 of the encapsulant 5. The upper portion 4*b* may be disposed in the second encapsulation layer 52 of the encapsulant 5. The first portion 4*b* (e.g., the upper portion 4*b*) of the interconnector 4 may extend beyond the first top surface 511 of the first encapsulation layer 51. The second portion 4*a* (e.g., the lower portion 4*a*) of the interconnector 4 may be embedded in the first encapsulation layer 51. A thickness of the upper portion 4*b* of the interconnector 4 (e.g., a thickness $T_{4b}$ of the first portion 4*b* of the interconnector 4 or the pillar 41) may be less than a thickness of the lower portion 4*a* of the interconnector 4 (e.g., a thickness $T_{4a}$ of the second portion 4*a* of the pillar 41**).

The bumps 42 may include a plurality of conductive bumps or a plurality of metal bumps, and may be disposed between the first electronic device 3 and the first patterned circuit structure 6. The bumps 42 may be disposed adjacent to the first surface 31 (e.g., the top surface or the active surface) of the first electronic device 3. For example, the bumps 42 may protrude from or protrude beyond the first surface 31 (e.g., the top surface or the active surface) of the first electronic device 3, and may be electrically connected to the circuit layer 34 of the first electronic device 3. Thus, the first patterned circuit structure 6 is electrically connected to the first electronic device 3 through the bumps 42. The top surfaces 421 of the bumps 42 may be exposed by the first encapsulation layer 51. The top surfaces 421 of the bumps 42 may be not aligned with or co-level with the first top surface 511 of the first encapsulation layer 51. The top surfaces 421 of the bumps 42 may be higher than the first top surface 511 of the first encapsulation layer 51. The bumps 42 may protrude from the first top surface 511 of the first encapsulation layer 51. The top surfaces 421 of the bumps 42 may be aligned with or co-level with each other.

The pillars 41 may include a plurality of conductive pillars or a plurality of metal pillars, and may be disposed between the second patterned circuit structure 2 and the first patterned circuit structure 6. The pillars 41 may be disposed adjacent to or may outflank the first electronic device 3. As shown in FIG. 1, the pillars 41 are disposed on and electrically connected to the second patterned circuit structure 2. Thus, the first patterned circuit structure 6 is electrically connected to the second patterned circuit structure 2 through the pillars 41. In some embodiments, most of the pillars 41 may be adapted for signal transmission. However, still some of the pillars 41 may serve for other functions, such as power delivery. A width of the pillar 41 may be greater than a width of the bump 42. A length of the pillar 41 may be greater than a length of the bump 42. A distribution density of the pillars 41 may be less than a distribution density of the bumps 42. A pitch between two adjacent pillars 41 may be greater than a pitch between two adjacent bumps 42.

The encapsulant 5 may be disposed between the second patterned circuit structure 2 and the first patterned circuit structure 6, and may encapsulate the first electronic device 3, the adhesion layer 35 and the interconnector 4 (including, for example, the pillars 41 and the bumps 42). The encapsulant 5 may have a first surface 53 (e.g., a top surface) and a second surface 54 (e.g., a bottom surface) opposite to the first surface 53. The first surface 53 (e.g., the top surface) of the encapsulant 5 may be substantially coplanar with or co-level with the top surfaces of the interconnector 4 (including the top surfaces 411 of the pillars 41 and the top surfaces 421 of the bumps 42). The second surface 54 (e.g., the bottom surface) of the encapsulant 5 may contact the second patterned circuit structure 2.

Figure 3:
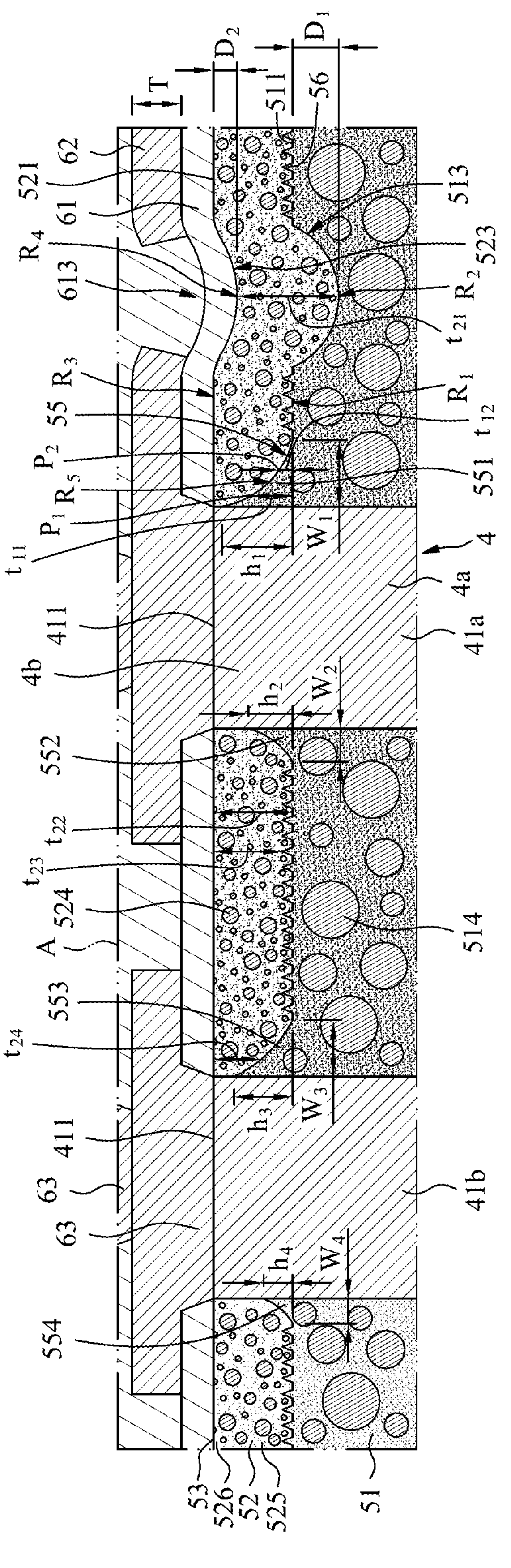
FIG. 3 illustrates a partially enlarged view of a region "A" in FIG. 2.

As shown in FIG. 1, the encapsulant 5 may include a first encapsulation layer 51 and a second encapsulation layer 52 disposed over or disposed on the first encapsulation layer 51. The first encapsulation layer 51 may be also referred to as "a molding layer", "a first portion" or "a first encapsulant". The first encapsulation layer 51 may encapsulate the lower portion **4*a* (e.g., the second portion 4*a*) of the interconnector 4. The first encapsulation layer 51 may include a base material and a plurality of first fillers 514 (FIG. 3). A material of the first fillers 514 may be same as a material of a portion of the first electronic device 3. However, the first encapsulation layer 51 may be free of fillers. Thus, the first encapsulation layer 51 may not include the first fillers. In some embodiments, the base material of the first encapsulation layer 51 may include a molding compound, such as epoxy or polyimide (PI). The first encapsulation layer 51 may have a first top surface 511 and a first bottom surface 512 opposite to the first top surface 511. The first top surface 511 of the first encapsulation layer 51 may be adjacent to the upper portion 4*b* (e.g., the first portion 4*b*) of the interconnector 4, and may contact the second encapsulation layer 52. The first bottom surface 512 of the first encapsulation layer 51 may contact the second patterned circuit structure 2. The top surfaces of the interconnector 4 (including the top surfaces 411 of the pillars 41 and the top surfaces 421 of the bumps 42) may be higher than the first top surface 511 of the first encapsulation layer 51**.

Further, the second encapsulation layer 52 may be also referred to as "a dielectric layer", "a second portion" or "a protection layer". The second encapsulation layer 52 may encapsulate the upper portion **4*b* (e.g., the first portion 4*b*) of the interconnector 4. The second encapsulation layer 52 may include a base material and a plurality of second fillers 524 (FIG. 3). However, the second encapsulation layer 52 may be free of fillers. Thus, the second encapsulation layer 52 may not include the second fillers. In some embodiments, the base material of the second encapsulation layer 52 may include an insulation layer, an oxide layer or a polymer layer. The material of the base material of the second encapsulation layer 52 may include silicon oxide, epoxy and polyimide (PI). The second encapsulation layer 52 may have a second top surface 521 and a second bottom surface 522 opposite to the second top surface 521. An elevation of the second top surface 521 of the second encapsulation layer 52 may be higher than an elevation of the first top surface 511 of the first encapsulation layer 51. The second top surface 521 of the second encapsulation layer 52 may face the first patterned circuit structure 6. The second bottom surface 522 of the second encapsulation layer 52 may face the first top surface 511 of the first encapsulation layer 51. The second encapsulation layer 52 may be closer to the top surface 411 of the pillar 41 (or the top surface 421 of the bump 42) than the first encapsulation layer 51 is. The second encapsulation layer 52 may be in a liquid state before a curing process. The second top surface 521 of the second encapsulation layer 52 may be substantially co-level with the top surfaces of the interconnector 4 (including the top surfaces 411 of the pillars 41 and the top surfaces 421 of the bumps 42). The top surface of the interconnector 4 (including the top surface 411 of the pillars 41 and the top surface 421 of the bumps 42) may be substantially aligned with the second top surface 521 of the second encapsulation layer 52. The top surface of the interconnector 4 (including the top surface 411 of the pillars 41 and the top surface 421 of the bumps 42) may be exposed by a second top surface 521 of the second encapsulation layer 52**.

The second encapsulation layer 52 may be formed on and may directly contact the first top surface 511 of the first encapsulation layer 51. Thus, the second bottom surface 522 of the second encapsulation layer 52 and the first top surface 511 of the first encapsulation layer 51 may be the interface between the first encapsulation layer 51 and the second encapsulation layer 52. The second top surface 521 of the second encapsulation layer 52 may be the first surface 53 (e.g., the top surface) of the encapsulant 5. The first bottom surface 512 of the first encapsulation layer 51 may be the second surface 54 (e.g., the bottom surface) of the encapsulant 5.

In some embodiments, a free shrinkage ratio of the second encapsulation layer 52 may be different from a free shrinkage ratio of the first encapsulation layer 51. Thus, a shrinkage ratio of the encapsulant 5 may be in a range between the free shrinkage ratio of the second encapsulation layer 52 and the free shrinkage ratio of the first encapsulation layer 51. For example, the free shrinkage ratio of the second encapsulation layer 52 may be greater than the free shrinkage ratio of the first encapsulation layer 51. Thus, the shrinkage ratio of the encapsulant 5 may be in a range from the free shrinkage ratio of the first encapsulation layer 51 to the free shrinkage ratio of the second encapsulation layer 52. The first encapsulation layer 51 may be configured to reduce the shrinkage ratio of the encapsulant 5. The second encapsulation layer 52 may be configured to increase the shrinkage ratio of the encapsulant 5. The shrinkage ratio may be defined as a ratio of given volume change expressed as a percentage of dry volume to the corresponding change. For example, a polymer material may shrink due to solvent evaporation. In a comparative embodiment, the encapsulant 5 may only include the material of the second encapsulation layer 52 such as polyimide (PI), and the material of the first encapsulation layer 51 may be omitted. The large free shrinkage ratio of the encapsulant 5 (e.g., only the second encapsulation layer 52) may cause a severe warpage of the package structure 1. In another comparative embodiment, the encapsulant 5 may only include the material of the first encapsulation layer 51 such as molding compound with the first fillers 514, and the material of the second encapsulation layer 52 may be omitted. Some of the first fillers 514 may be removed during a grinding process, void(s) or opening(s) may be formed on the first surface 53 (e.g., the top surface) of the encapsulant 5. Thus, the encapsulant 5 of the present disclosure may include at least two encapsulation layers to address such concerns.

The first encapsulation layer 51 may be configured to encapsulate the first electronic device 3. The second encapsulation layer 52 may be configured to be ground by the grinding tool. Thus, the first encapsulation layer 51 may cover and contact the first surface 31 (e.g., the top surface or the active surface) of the first electronic device 3. The second encapsulation layer 52 may not contact the first electronic device 3. The second encapsulation layer 52 may be spaced apart from the first electronic device 3 through the first encapsulation layer 51. An elevation of the interface (e.g. the second bottom surface 522 of the second encapsulation layer 52 or the first top surface 511 of the first encapsulation layer 51) may be higher than an elevation of the first surface 31 (e.g., the top surface or the active surface) of the first electronic device 3. Both of the first encapsulation layer 51 and the second encapsulation layer 52 may cover the lateral surfaces of the interconnector 4 (including, for example, the pillars 41 and the bumps 42). The interconnector 4 (including, for example, the pillars 41 and the bumps 42) may extend through the interface (e.g. the second bottom surface 522 of the second encapsulation layer 52 or the first top surface 511 of the first encapsulation layer 51) between the first encapsulation layer 51 and the second encapsulation layer 52.

The interconnector 4 (including, for example, the pillars 41 and the bumps 42) may be disposed in the first encapsulation layer 51 and may extend through the second encapsulation layer 52. Thus, the interconnector 4 (including, for example, the pillars 41 and the bumps 42) may extend from the first encapsulation layer 51 to the second encapsulation layer 52, and may be exposed from the second encapsulation layer 52. For example, the pillars 41 may extend from the first bottom surface 512 of the first encapsulation layer 51 (i.e., the second surface 54 of the encapsulant 5) to the second top surface 521 of the second encapsulation layer 52 (i.e., the first surface 53 of the encapsulant 5). The bumps 42 may extend from the first surface 31 (e.g., the top surface or the active surface) of the first electronic device 3 to the second top surface 521 of the second encapsulation layer 52 (i.e., the first surface 53 of the encapsulant 5).

In some embodiments, the interconnector 4 (including, for example, the pillars 41 and the bumps 42) may be a monolithic structure, and may continuously extend from the first encapsulation layer 51 to the second encapsulation layer 52. Thus, the interconnector 4 (including, for example, the pillars 41 and the bumps 42) may have a single smooth lateral surface continuously extending from a first position contacting the first encapsulation layer 51 to a second position contacting the second encapsulation layer 52. For example, each of the pillars 41 may be a monolithic structure, and may continuously extend from the first encapsulation layer 51 to the second encapsulation layer 52. The pillar 41 may have a single smooth lateral surface continuously extending from a first position contacting the first encapsulation layer 51 to a second position contacting the second encapsulation layer 52. That is, a first portion of the lateral surface of the pillar 41 in the first encapsulation layer 51 and a second portion of the lateral surface of the pillar 41 in the second encapsulation layer 52 are continuous, and are the same surface, since they are formed at a same manufacturing step. Therefore is no interface between the first portion of the lateral surface of the pillar 41 in the first encapsulation layer 51 and the second portion of the lateral surface of the pillar 41 in the second encapsulation layer 52. In addition, each of the bumps 42 may be a monolithic structure, and may continuously extend from the first encapsulation layer 51 to the second encapsulation layer 52. The bump 42 may have a single smooth lateral surface continuously extending from a first position contacting the first encapsulation layer 51 to a second position contacting the second encapsulation layer 52. That is, a first portion of the lateral surface of the bump 42 in the first encapsulation layer 51 and a second portion of the lateral surface of the bump 42 in the second encapsulation layer 52 are continuous, and are the same surface, since they are formed at a same manufacturing step. Therefore is no interface between the first portion of the lateral surface of the bump 42 in the first encapsulation layer 51 and the second portion of the lateral surface of the bump 42 in the second encapsulation layer 52.

Each of the pillars 41 may have a top surface 411, and each of the bumps 42 may have a top surface 421. Since the top surface of the interconnector 4 (including, for example, the pillars 41 and the bumps 42) and the second top surface 521 of the second encapsulation layer 52 may be ground concurrently during a grinding process. After the grinding process, the top surface of the interconnector 4 (including, for example, the pillars 41 and the bumps 42) may be substantially co-level or co-planar with the second top surface 521 of the second encapsulation layer 52. For example, the top surfaces 411 of the pillars 41 and the top surfaces 421 of the bumps 42 may be substantially co-level with, co-planar with or aligned with the second top surface 521 of the second encapsulation layer 52. The top surface of the interconnector 4 (including, for example, the top surfaces 411 of the pillars 41 and the top surfaces 421 of the bumps 42) may be substantially co-level or co-planar with the second top surface 521 of the second encapsulation layer 52. The top surfaces 411 of the pillars 41 and the top surfaces 421 of the bumps 42 may be exposed by the second top surface 521 of the second encapsulation layer 52.

In some embodiments, the first top surface 511 of the first encapsulation layer 51 may include an unground surface, and the second top surface 521 of the second encapsulation layer 52 may include a ground surface. Thus, a roughness of the first surface 53 (e.g., the top surface) of the encapsulant 5 (i.e., the second top surface 521 of the second encapsulation layer 52) may be different from a roughness of the interface between the first encapsulation layer 51 and the second encapsulation layer 52 (i.e., the first top surface 511 of the first encapsulation layer 51). For example, the roughness of the first surface 53 (e.g., the top surface) of the encapsulant 5 (i.e., the second top surface 521 of the second encapsulation layer 52) may be greater than the roughness of the interface between the first encapsulation layer 51 and the second encapsulation layer 52 (i.e., the first top surface 511 of the first encapsulation layer 51). In some embodiments, the first top surface 511 of the first encapsulation layer 51 may be smoother than the second top surface 521 of the second encapsulation layer 52 since the first top surface 511 of the first encapsulation layer 51 is not ground and its smoothness is determined by a tape.

An uniformity of the first surface 53 (e.g., the top surface) of the encapsulant 5 (i.e., the second top surface 521 of the second encapsulation layer 52) may be, e.g., less than about 1%, less than about 2%, less than about 5%, or less than about 10%. The second top surface 521 of the second encapsulation layer 52 may be flatter than the second bottom surface 522 of the second encapsulation layer 52. In some embodiments, the uniformity may be determined or measured based on points of a surface. For example, multiple points (e.g., 5 points) of the surface may be selected randomly. A thickness of a layer or a film (e.g., thickness of the second encapsulation layer 52) at each point is measured. Uniformity of the surface may be defined as, e.g., a difference between the maximal thickness and the minimal thickness, divided by twice an average of the thickness values at the selected points:

$$\text{uniformity} = \frac{x_{max} - x_{min}}{2 \times \bar{x}_t} \times 100\%.$$

The first patterned circuit structure 6 may be a conductive structure, a wiring structure, a stacked structure, a redistribution layer (RDL) structure or a substrate structure. The first patterned circuit structure 6 may be disposed over the second top surface 521 of the second encapsulation layer 52 of the encapsulant 5, and spaced apart from the first encapsulation layer 51. The first patterned circuit structure 6 may be electrically connected to the interconnector 4 (including, for example, the pillars 41 and the bumps 42). The first patterned circuit structure 6 may be electrically connected to the first electronic device 3 through the bumps 42. The first patterned circuit structure 6 may be electrically connected to the second patterned circuit structure 2 through the pillars 41. As shown in FIG. 1, the first patterned circuit structure 6 and the second patterned circuit structure 2 are respectively disposed adjacent to the first surface 53 and the second surface 54 of the encapsulant 5.

The first patterned circuit structure 6 may include at least one dielectric layer 61 and at least one circuit layer 62. The circuit layer 62 may be disposed over the second top surface 521 of the second encapsulation layer 52 of the encapsulant 5, and may be electrically connected to the interconnector 4 (including, for example, the pillars 41 and the bumps 42). The circuit layer 62 may be a patterned redistribution layer, and may be embedded in the dielectric layers 61. As shown in FIG. 1, the first patterned circuit structure 6 includes three dielectric layers 61 and two circuit layers 62. However, the amount of the dielectric layers 61 and the amount of the circuit layers 62 are not limited in the present disclosure. In some embodiments, the circuit layer 62 may include a seed layer and a conductive layer on the seed layer. However, in other embodiments, the seed layer may be omitted. The circuit layer 62 of the first patterned circuit structure 6 may include at least one trace, at least one inner via 63 and at least one pad 64. The inner via 63 may connect the trace. The inner via 63 may taper downwardly. Thus, a tapering direction of the inner via 63 of the first patterned circuit structure 6 may be same as a tapering direction of the inner via 23 of the second patterned circuit structure 2. An interface (e.g., the top surface 411 of the pillar 41) between the inner via 63 of the first patterned circuit structure 6 and the interconnector 4 may be substantially co-level with the second top surface 521 of the second encapsulation layer 52. In some embodiments, the first patterned circuit structure 6 may include at least one die-bonding region, and the pad 64 is disposed in the die-bonding region. The die-bonding region may be at least partially disposed within a vertical projection region of the first electronic device 3 on the first patterned circuit structure 6. A portion of the encapsulant 5 (including the first encapsulation layer 51 and the second encapsulation layer 52) is disposed between the first patterned circuit structure 6 and the first electronic device 3.

The second electronic device 12 may be disposed on the first patterned circuit structure 6 and above the first electronic device 3 and the pillars 41. In some embodiments, the second electronic device 12 may be disposed in or within a die-bonding region. The second electronic device 12 may include at least one dielectric layer 123, at least one circuit layer 124 and at least one bump 125. The circuit layer 124 may be a patterned circuit layer, and may be embedded in the dielectric layers 123. The circuit layer 124 may be a back end of line (BEOL). The bump 125 may be electrically connected to the pad 64 of the first patterned circuit structure 6 through the solder materials 14. The third electronic device 13 may be disposed on the first patterned circuit structure 6 and above the first electronic device 3 and the pillars 41. In some embodiments, the third electronic device 13 may be disposed in or within a die-bonding region. The third electronic device 13 may include at least one dielectric layer 133, at least one circuit layer 134 and at least one bump 135. The circuit layer 134 may be a patterned circuit layer, and may be embedded in the dielectric layers 133. The circuit layer 134 may be a back end of line (BEOL). The bump 135 may be electrically connected to the pad 64 of the first patterned circuit structure 6 through the solder materials 14.

The third electronic device 13 is disposed side-by-side or adjacent to the second electronic device 12, and on the first patterned circuit structure 6. A lateral surface of the second electronic device 12 faces the third electronic device 13. The second electronic device 12 and the third electronic device 13 may be electrically communicated with each other through the bumps 42 and the first electronic device 3. In some embodiments, the second electronic device 12 may be a semiconductor die, such as an application specific integrated circuit (ASIC) die. The third electronic device 13 may also be a semiconductor die, such as a memory die (e.g., a high bandwidth memory (HBM)).

The underfill 15 may be disposed between the second electronic device 12, the third electronic device 13 and the first patterned circuit structure 6, and may cover the solder materials 14, the bump 125, 135 and the pads 64. The protection material 16 may be an encapsulant such as a molding compound with or without fillers. The protection material 16 may be disposed on the first patterned circuit structure 6 and may encapsulate the second electronic device 12, the third electronic device 13 and the underfill 15. However, in some embodiments, the underfill 15 may be omitted, and the protection material 16 may be disposed between the second electronic device 12, the third electronic device 13 and the first patterned circuit structure 6, and may cover the solder materials 14, the bump 125, 135 and the pads 64.

The external connector 17 may be disposed below and electrically connected to the second patterned circuit structure 2 for external connection. The external connector 17 may be disposed on an inner via 23 exposed by the bottom surface of the second patterned circuit structure 2. In some embodiments, the external connector 17 may include a metal bump or a solder material.

In the embodiment illustrated in FIG. 1, during the grinding process, only the second encapsulation layer 52 may be ground by the grinding tool. Thus, the second encapsulation layer 52 may be configured to prevent the first encapsulation layer 51 from being ground during the grinding process. The second encapsulation layer 52 may be configured to receive a grinding force for the first encapsulation layer 51 during a grinding process. The second encapsulation layer 52 may be configured to prevent the first fillers 514 of the first encapsulation layer 51 from being removed during the grinding process so as to prevent any void or opening from forming on the first top surface 511 of the first encapsulation layer 51 or on the first surface 53 (e.g., the top surface) of the encapsulant 5. The second encapsulation layer 52 may be configured to be a sacrificial layer (or a buffer layer) during the grinding process. Therefore, the second encapsulation layer 52 may be configured to maintain or ensure a flatness or a smoothness of the first surface 53 (e.g., the top surface) of the encapsulant 5 during the grinding process, so as to facilitate the formation of the first patterned circuit structure 6 and improve the quality of the first patterned circuit structure 6, which improves the yield rate of the package structure 1.

Figure 1A:
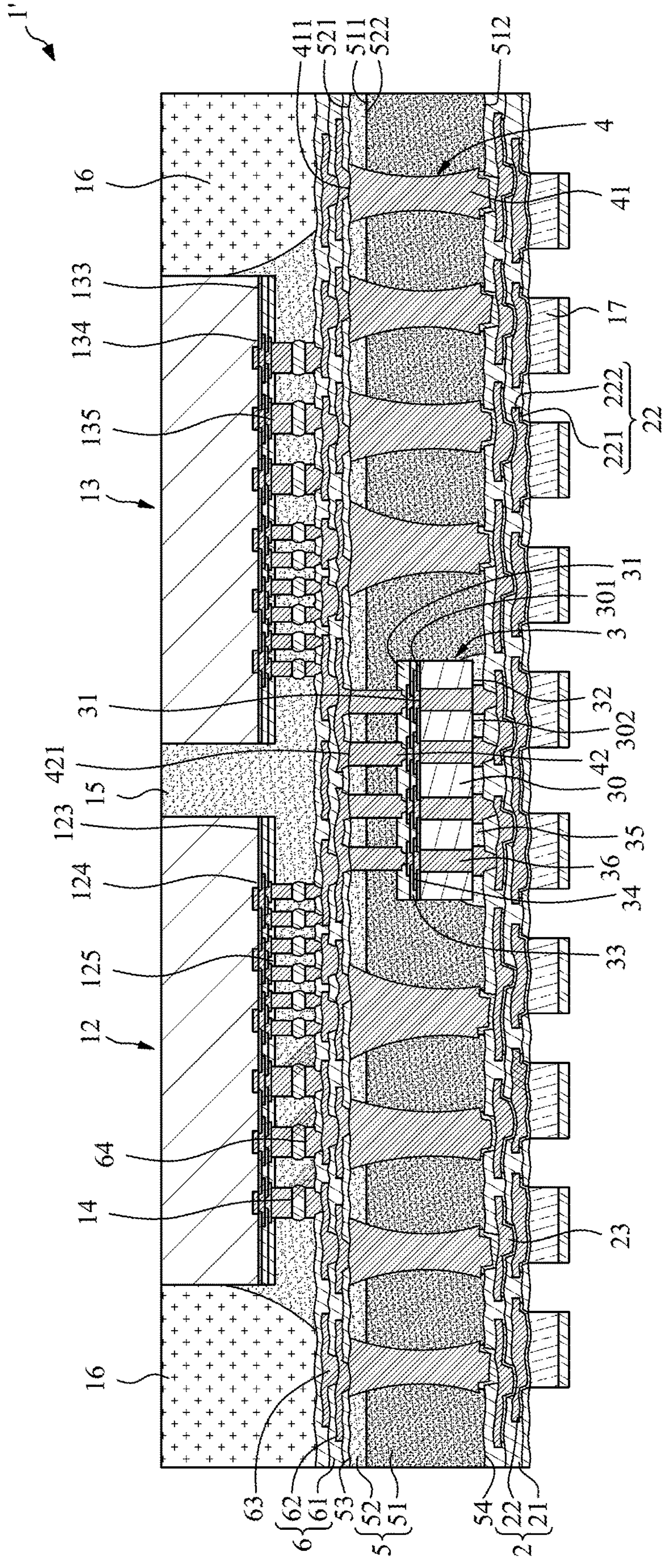
FIG. 1A illustrates a cross-sectional view of a package structure according to some embodiments of the present disclosure.

FIG. 1A illustrates a cross-sectional view of a package structure 1' according to some embodiments of the present disclosure. The package structure 1' of FIG. 1A is similar to the package structure 1 of FIG. 1, and the differences therebetween may be described as follows.

The bumps 125 of the second electronic device 12 may have different widths. The bumps 135 of the third electronic device 13 may have different widths. A thickness of the circuit layer 62 (e.g., the trace) of the first patterned circuit structure 6 may be less than a thickness of the circuit layer 22 (e.g., the trace) of the second patterned circuit structure 2. The width of the inner via 63 may be less than a width of the top surface 411 of the pillar 41. A central axis of the inner via 63 may be not aligned with a central axis of the pillar 41. The inner vias 63 may have different widths. The lateral surfaces of the inner vias 63 may have different slopes. The bottom end of the bump 42 may have a smaller width. Thus, a portion of the dielectric layer 33 may extend to a space right under the bump 42. The lateral surface of the pillar 41 may have a curved surface. The pillars 41 may have different widths. The pillar 41 may taper toward the second patterned circuit structure 2.

In some embodiments, the adhesion layer 35 may be pressed and may extend to a lateral surface of the first electronic device 3. In other embodiments, the main body 30 may include a plurality of through vias 36 extending through the main body 30 and electrically connected to the second patterned circuit structure 2 through a plurality of solders and/or bumps. Thus, the circuit layer 34 of the first electronic device 3 may be electrically connected to the second patterned circuit structure 2 through the through vias 36. The power from the external connector 17 may be transmitted to the second electronic device 12 and the third electronic device 13 through the through vias 36.

Figure 2:
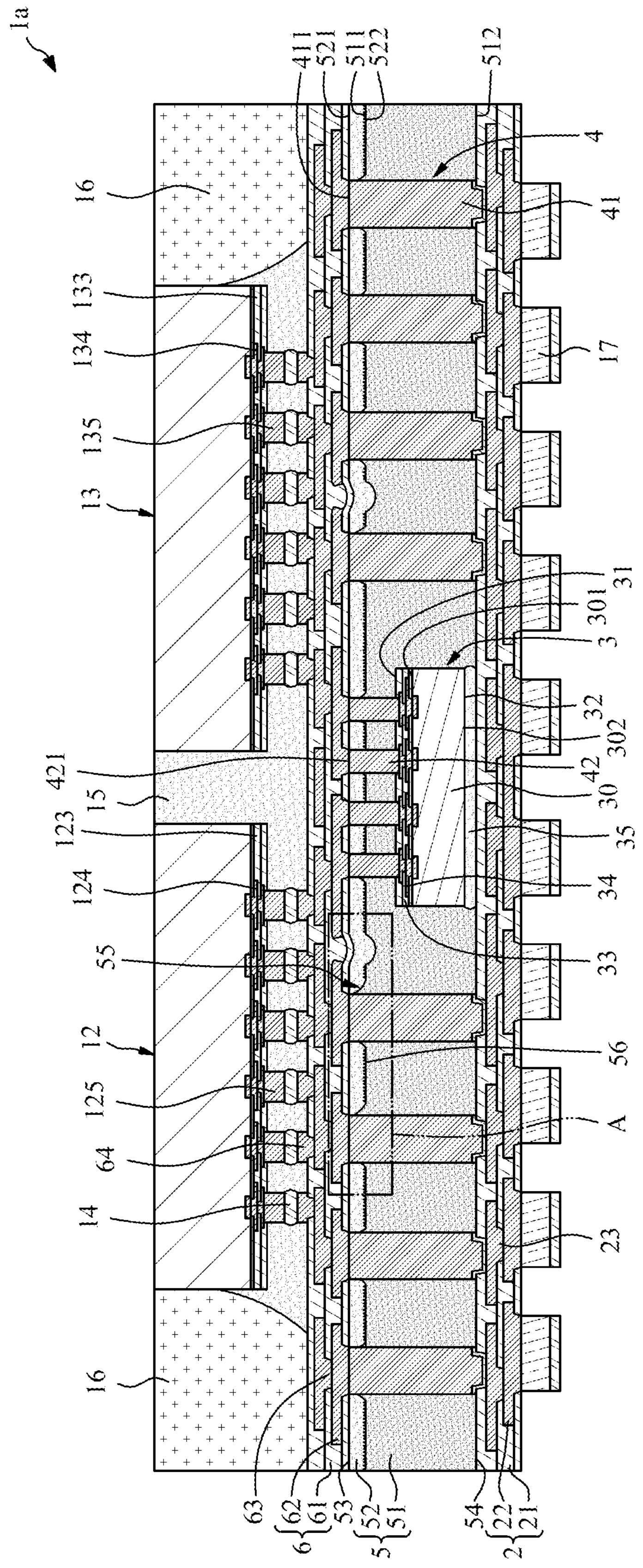
FIG. 2 illustrates a cross-sectional view of a package structure according to some embodiments of the present disclosure.

FIG. 2 illustrates a cross-sectional view of a package structure 1*a* according to some embodiments of the present disclosure. FIG. 3 illustrates a partially enlarged view of a region "A" in FIG. 2. The package structure 1*a* of FIG. 2 is similar to the package structure 1 of FIG. 1, and the differences therebetween may be described as follows.

The first encapsulation layer 51 (e.g., the molding layer) of the encapsulant 5 may define a first recess 513 (or a void or an opening) recessed from the first top surface 511 of the first encapsulation layer 51. The first top surface 511 of the first encapsulation layer 51 may include the first recess 513. The second encapsulation layer 52 (e.g., the dielectric layer) of the encapsulant 5 may define a second recess 523 (or a void or an opening) recessed from the second top surface 521 and corresponding to the first recess 513. The second top surface 521 of the second encapsulation layer 52 may include the second recess 523. In some embodiments, the second recess 523 (or a void or an opening) may not correspond to the first recess 513. A curvature of a bottom surface of the first recess 513 may be different from a curvature of a bottom surface of the second recess 523. For example, the curvature of the bottom surface of the first recess 513 may be less than the curvature of the bottom surface of the second recess 523.

The dielectric layer 61 of the first patterned circuit structure 6 may extend into the second recess 523, and may define a recess 613. A portion of the circuit layer 62 (e.g., the trace) of the first patterned circuit structure 6 may extend into the recess 613. The portion of the circuit layer 62 (e.g., the trace) of the first patterned circuit structure 6 may be disposed over the second recess 523 and may be conformal with the second recess 523. In some embodiments, a depth D of the second recess 523 may be less than a thickness T of the circuit layer 62 of the first patterned circuit structure 6. Thus, the first recess 513, the second recess 523 and the recess 613 may not may adversely affect the quality of the first patterned circuit structure 6 and the yield rate of the package structure 1.

In addition, the first encapsulation layer 51 of the encapsulant 5 may include a plurality of first fillers 514, and the second encapsulation layer 52 of the encapsulant 5 may include a plurality of second fillers 524. A particle size (e.g., diameter) of the first filler 514 in the first encapsulation layer 51 of the encapsulant 5 may be greater than a particle size (e.g., diameter) of the second filler 524 in the second encapsulation layer 52 of the encapsulant 5. The diameter of the second filler 524 may be less than the diameter of the first filler 514. A depth of the first recess 513 may be greater than or less than the particle size (e.g., diameter) of the first filler 514. The depth D of the second recess 523 may be greater than or less than the particle size (e.g., diameter) of the second filler 524. The first fillers 514 are not exposed by the first top surface 511 of the first encapsulation layer 51. A portion of the second fillers 524 may be disposed in the first recess 513. A thickness T of the circuit layer 62 (e.g., the trace) may be greater than the diameter of the second filler 524. In some embodiments, some of the second fillers 524 may be truncated. The truncated surface of the second filler 524 may be aligned with or coplanar with the second top surface 521 of the second encapsulation layer 52. Thus, the truncated surface of the second filler 524 may be exposed by the second top surface 521 of the second encapsulation layer 52.

The interconnector 4 (e.g., the pillars 41 and the bumps 42) may protrude from the first encapsulation layer 51 (e.g., the molding layer) of the encapsulant 5. The first encapsulation layer 51 (e.g., the molding layer) of the encapsulant 5 may include a protrusion structure 55 protruding from the first top surface 511 of the first encapsulation layer 51 (e.g., the molding layer) of the encapsulant 5 and contacting the interconnector 4. The protrusion structure 55 may surround or may be disposed around the interconnector 4. The second encapsulation layer 52 (e.g., the dielectric layer) of the encapsulant 5 may cover the interconnector 4 and the first encapsulation layer 51 (e.g., the molding layer). The second encapsulation layer 52 (e.g., the dielectric layer) of the encapsulant 5 may have a non-consistent thickness. A top surface of the interconnector 4 (e.g., the top surface 411 of the pillar 41 and the top surface 421 of the bump 42) may be exposed by the second top surface 521 of the second encapsulation layer 52 (e.g., the dielectric layer).

In some embodiments, an elevation difference (or elevation variation) of the first top surface 511 of the first encapsulation layer 51 may be greater than an elevation difference (or elevation variation) of the second top surface 521 of the second encapsulation layer 52. The elevation difference (or elevation variation) of the second top surface 521 of the second encapsulation layer 52 may be less than the elevation difference (or elevation variation) of the first top surface 511 of the first encapsulation layer 51. As shown in FIG. 3, the first top surface 511 of the first top surface 511 may include a first region $R_1$ and a second region $R_2$ different from the first region $R_1$. The second top surface 521 may include a third region $R_3$ and a fourth region $R_4$ different from the third region $R_3$. A first elevation difference (e.g., a first vertical distance $D_1$) between a first elevation of the first region $R_1$ and a second elevation of the second region $R_2$ is less than a second elevation difference (e.g., a second vertical distance $D_2$) between a third elevation of the third region $R_3$ and a fourth elevation of the fourth region $R_4$.

The protrusion structure 55 of the first encapsulation layer 51 may include a first portion $P_1$ adjacent to the interconnector 4 (e.g., the pillar 41) and a second portion $P_2$ far away from the interconnector 4 (e.g., the pillar 41) along a horizontal direction. The protrusion structure 55 may have a first thickness $t_{11}$ at a first portion $P_1$ and a second thickness $t_{12}$ at a second portion $P_2$. The first thickness $t_{11}$ and the second thickness $t_{12}$ may be measured with respect to the first top surface 511 of the first encapsulation layer 51 (e.g., the molding layer). The first portion $P_1$ is closer to the interconnector 4 than the second portion $P_2$ is, and the first thickness $t_{11}$ is greater than the second thickness $t_{12}$. Thus, the thickness of the protrusion structure 55 may increase gradually toward the interconnector 4. A thickness of the second encapsulation layer 52 may decrease toward the interconnector 4. In some embodiments, a top surface of the protrusion structure 55 may include a curved surface from a cross-sectional view. The first top surface 511 of the first encapsulation layer 51 may include a fifth region $R_5$ extending toward the upper portion **4*b* (e.g., the first portion 4*b*) of the interconnector 4. The second encapsulation layer 52 may include a second lower portion 525 and a second upper portion 526. The second lower portion 525 may laterally overlap the fifth region $R_5$. The second upper portion 526** may be free from laterally overlapping the fifth region $R_5$.

The interconnector 4 may include a first pillar **41*a* and a second pillar 41*b*. The protrusion structure 55 may include a first protrusion 551, a second protrusion 552, a third protrusion 553 and a fourth protrusion 554. The first protrusion 551 may contact a first side of the first pillar 41*a*, and may have a first maximum height $h_1$ and a first maximum width $W_1$. The second protrusion 552 may contact a second side of the first pillar 41*a* opposite to the first side of the first pillar 41*a*, and may have a second maximum height $h_2$ and a second maximum width $W_2$. A size of the first protrusion 551 may be different from a size of the second protrusion 552. For example, the size of the first protrusion 551 may be greater than the size of the second protrusion 552**. Thus, the first maximum height $h_1$ may be greater than the second maximum height $h_2$. The first maximum width $W_1$ may be greater than the second maximum width $W_2$.

The third protrusion 553 may contact a first side of the second pillar **41*b*, and may have a third maximum height $h_3$ and a third maximum width $W_3$. The fourth protrusion 554 may contact a second side of the second pillar 41*b* opposite to the first side of the second pillar 41*b*, and may have a fourth maximum height $h_4$ and a fourth maximum width $W_4$. A size of the third protrusion 553 may be different from a size of the fourth protrusion 554. For example, the size of the third protrusion 553 may be greater than the size of the fourth protrusion 554**. Thus, the third maximum height $h_3$ may be greater than the fourth maximum height $h_4$. The third maximum width $W_3$ may be greater than the fourth maximum width $W_4$.

In some embodiments, the size of the first protrusion 551, the size of the second protrusion 552, the size of the third protrusion 553 and the size of the fourth protrusion 554 may be different from each other. The size of the first protrusion 551 may be greater than the size of the third protrusion 553. The size of the third protrusion 553 may be greater than the size of the second protrusion 552. The size of the second protrusion 552 may be greater than the size of the fourth protrusion 554. Thus, the first maximum height $h_1$ may be greater than the third maximum height $h_3$. The third maximum height $h_3$ may be greater than the second maximum height $h_2$. The second maximum height $h_2$ may be greater than the fourth maximum height $h_4$. Further, the first maximum width $W_1$ may be greater than the third maximum width $W_3$. The third maximum width $W_3$ may be greater than the second maximum width $W_2$. The second maximum width $W_2$ may be greater than the fourth maximum width $W_4$.

The first encapsulation layer 51 (e.g., the molding layer) of the encapsulant 5 may further include a plurality of projections 56 protruding from the first top surface 511 of the first encapsulation layer 51 (e.g., the molding layer) and may be disposed far away from the interconnector 4. The protrusion structure 55 may be closer to the interconnector 4 than the projection 56 is. A size (including, for example, a height or a width) of one of the plurality of projections 56 may be less than a size (including, for example, a height or a width) of the protrusion structure 55. The projections 56 may be regularly distributed or irregularly distributed. Thus, the roughness of the first surface 53 (e.g., the top surface) of the encapsulant 5 (i.e., the second top surface 521 of the second encapsulation layer 52) may be less than the roughness of the interface between the first encapsulation layer 51 and the second encapsulation layer 52 (i.e., the first top surface 511 of the first encapsulation layer 51). The projections 56 are formed to increase the roughness so as to improve the adhesion or attachment between the first encapsulation layer 51 (e.g., the molding layer) and the second encapsulation layer 52 (e.g., the dielectric layer).

As shown in FIG. 3, the second encapsulation layer 52 (e.g., the dielectric layer) of the encapsulant 5 may have a first thickness $t_{21}$, a second thickness $t_{22}$, a third thickness $t_{23}$ and a fourth thickness $t_{24}$. The first thickness $t_{21}$ may correspond to a position at the first recess 513. The second thickness $t_{22}$ may correspond to a position at the first top surface 511 of the first encapsulation layer 51 (e.g., the molding layer). The third thickness $t_{23}$ may correspond to a position at a top end of the projection 56. The fourth thickness $t_{24}$ may correspond to a position at a top surface of the first protrusion 551. The first thickness $t_{21}$ may be greater than the second thickness $t_{22}$. The second thickness $t_{22}$ may be greater than the third thickness $t_{23}$. The third thickness $t_{23}$ may be greater than the fourth thickness $t_{24}$.

Figure 3A:
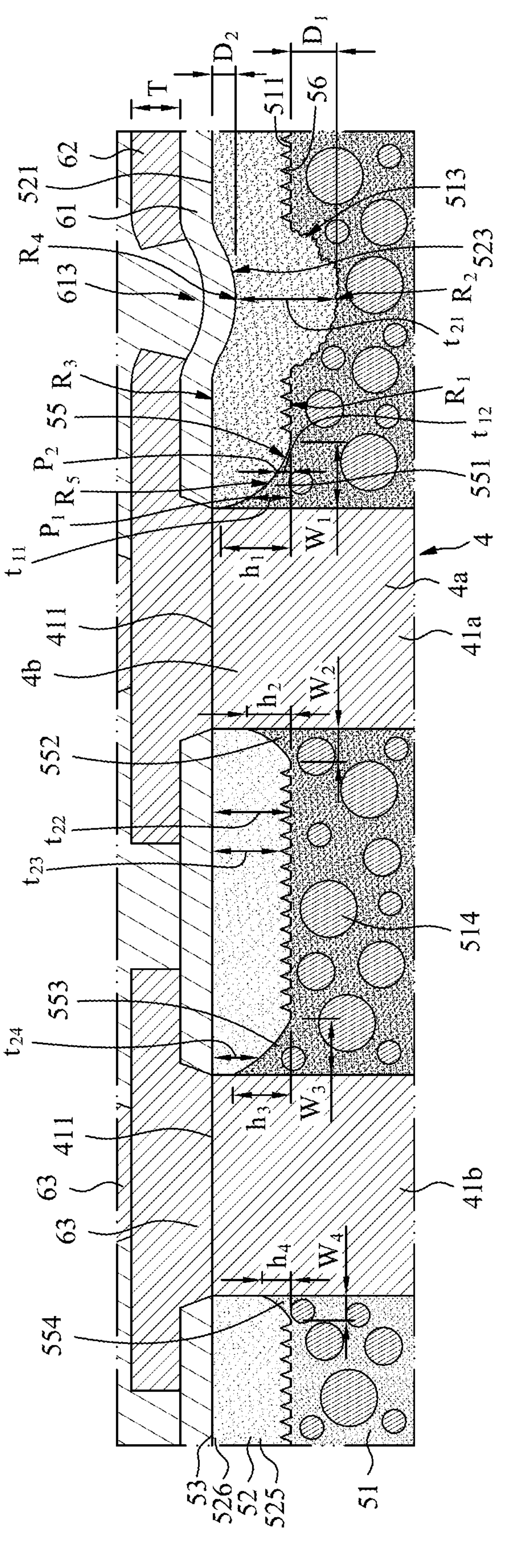
FIG. 3A illustrates a partially enlarged view of a region of a package structure according to some embodiments of the present disclosure.

FIG. 3A illustrates a partially enlarged view of a region of a package structure according to some embodiments of the present disclosure. The structure shown in FIG. 3A is similar to the structure shown in FIG. 3, and the differences therebetween may be described as follows. The second encapsulation layer 52 may be free of fillers. Thus, the second encapsulation layer 52 may not include any fillers. The bottom surface of the first recess 513 may include a rough surface or an irregular surface.

Figure 4:
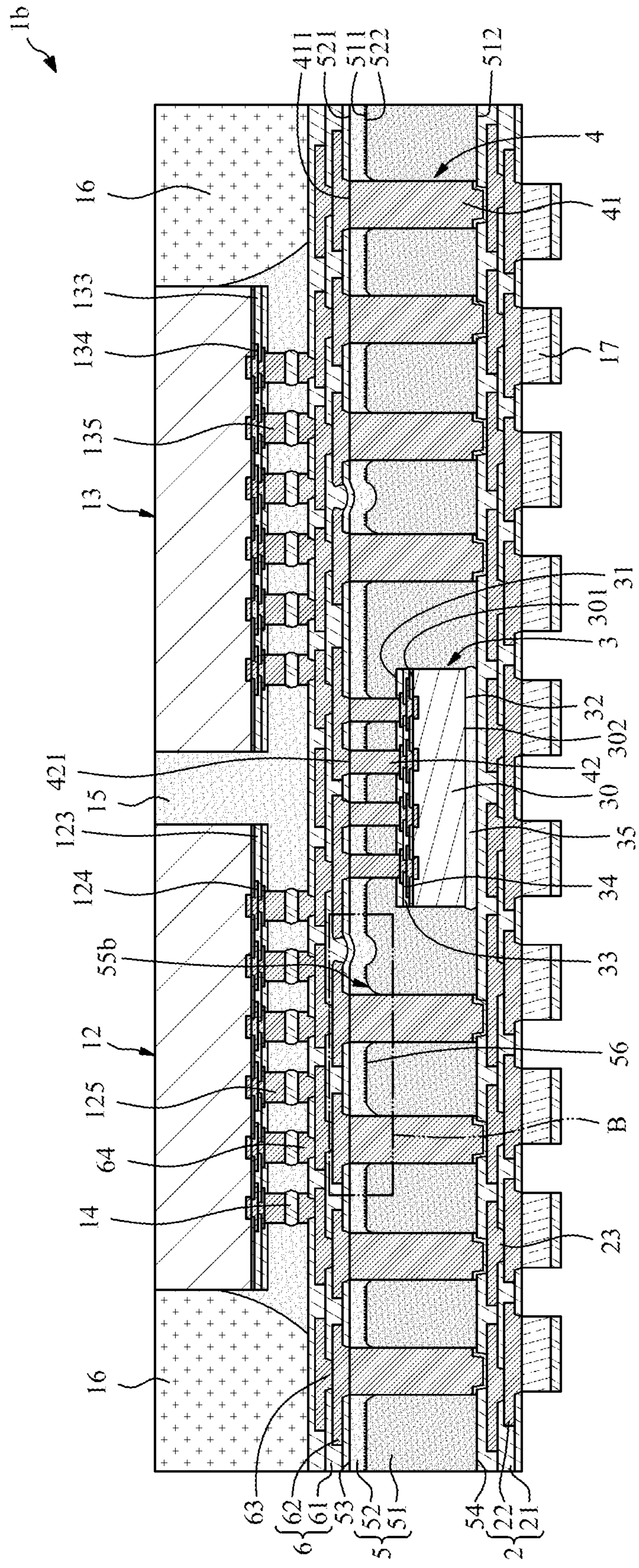
FIG. 4 illustrates a cross-sectional view of a package structure according to some embodiments of the present disclosure.
Figure 5:
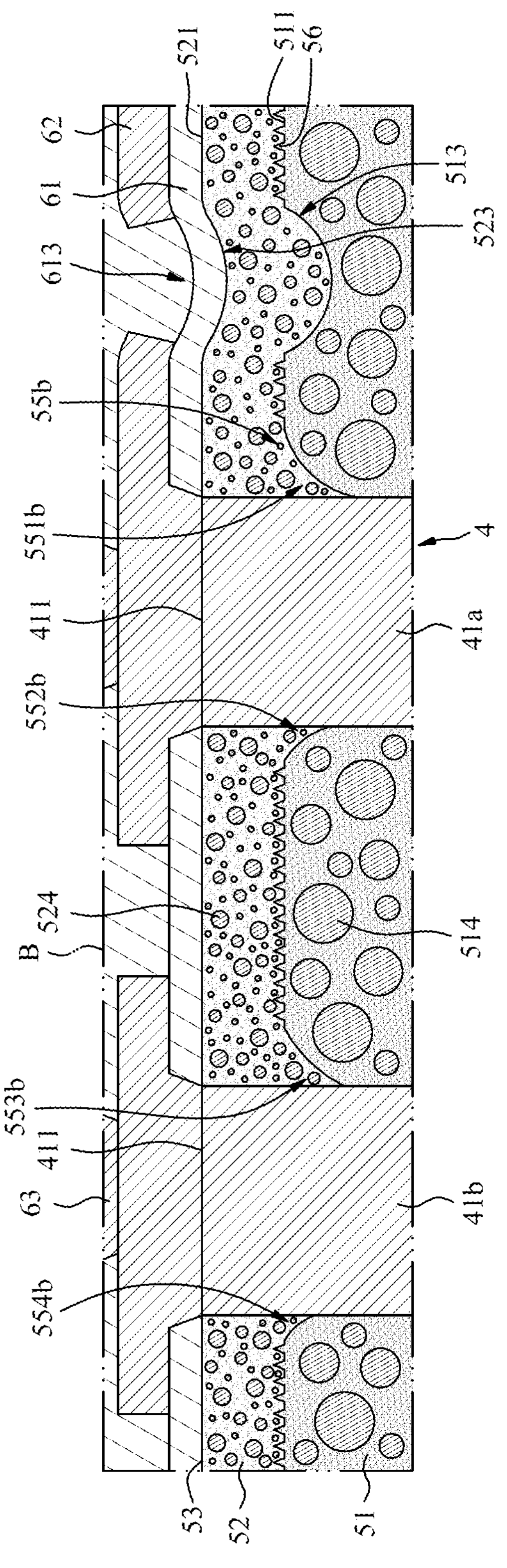
FIG. 5 illustrates a partially enlarged view of a region "B" in FIG. 4.

FIG. 4 illustrates a cross-sectional view of a package structure 1*b* according to some embodiments of the present disclosure. FIG. 5 illustrates a partially enlarged view of a region "B" in FIG. 4. The package structure 1*b* of FIG. 4 and FIG. 5 is similar to the package structure 1*a* of FIG. 2 and FIG. 3, and the differences therebetween may be described as follows.

The first encapsulation layer 51 (e.g., the molding layer) of the encapsulant 5 may define a dent portion 55*b* recessed from the first top surface 511 of the first encapsulation layer 51 (e.g., the molding layer) of the encapsulant 5 and exposing a portion of the interconnector 4. The dent portion 55*b* may surround or may be disposed around the interconnector 4. The second encapsulation layer 52 (e.g., the dielectric layer) of the encapsulant 5 may cover the interconnector 4 and extend into the dent portion 55*b* of the first encapsulation layer 51 (e.g., the molding layer). The width of the dent portion 55*b* may increase gradually toward the first top surface 511 of the first encapsulation layer 51 (e.g., the molding layer). In some embodiments, an inner surface of the dent portion 55*b* may include a curved surface from a cross-sectional view.

The dent portion 55*b* may include a first dent portion 551*b*, a second dent portion 552*b*, a third dent portion 553*b* and a fourth dent portion 554*b*. The first dent portion 551*b* may be disposed at the first side of the first pillar 41*a*. The second dent portion 552*b* may be disposed at the second side of the first pillar 41*a* opposite to the first side of the first pillar 41*a*. A size (e.g., a maximum depth or a maximum width) of the first dent portion 551*b* may be different from a size (e.g., a maximum depth or a maximum width) of the second dent portion 552*b*. For example, the size of the first dent portion 551*b* may be greater than the size of the second dent portion 552*b*.

The third dent portion 553*b* may be disposed at the first side of the second pillar 41*b*. The fourth dent portion 554*b* may be disposed at the second side of the second pillar 41*b* opposite to the first side of the second pillar 41*b*. A size (e.g., a maximum depth or a maximum width) of the third dent portion 553*b* may be different from a size (e.g., a maximum depth or a maximum width) of the fourth dent portion 554*b*. For example, the size of the third dent portion 553*b* may be greater than the size of the fourth dent portion 554*b*.

In some embodiments, the size of the first dent portion 551*b*, the size of the second dent portion 552*b*, the size of the third dent portion 553*b* and the size of the fourth dent portion 554*b* may be different from each other. The size of the first dent portion 551*b* may be greater than the size of the third dent portion 553*b*. The size of the third dent portion 553*b* may be greater than the size of the second dent portion 552*b*. The size of the second dent portion 552*b* may be greater than the size of the fourth dent portion 554*b*.

Figure 6:
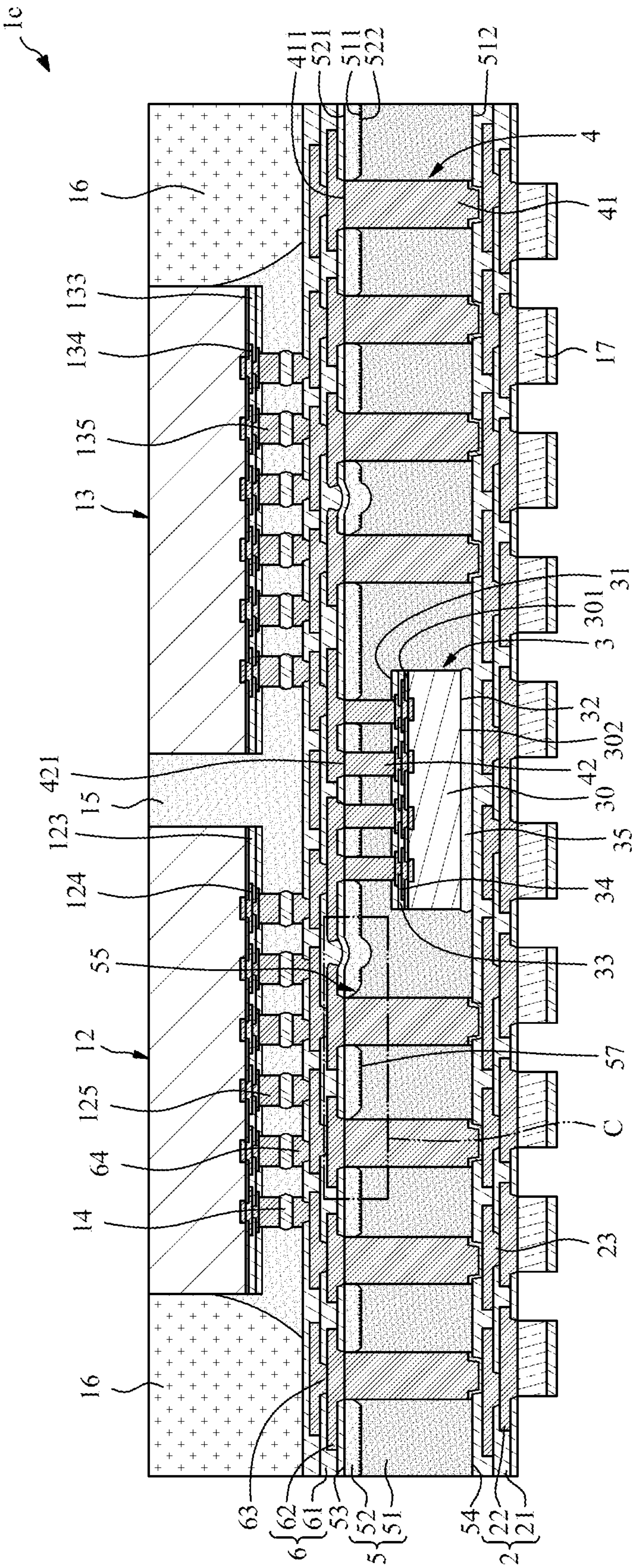
FIG. 6 illustrates a cross-sectional view of a package structure according to some embodiments of the present disclosure.
Figure 7:
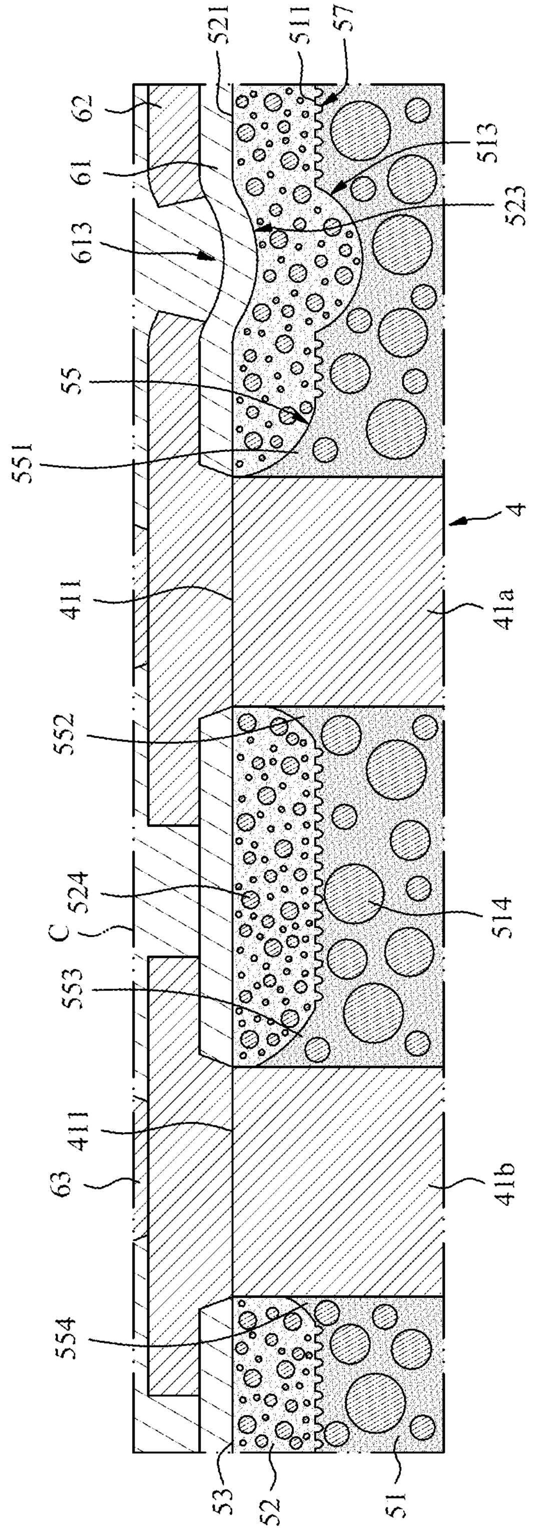
FIG. 7 illustrates a partially enlarged view of a region "C" in FIG. 6.

FIG. 6 illustrates a cross-sectional view of a package structure 1*c* according to some embodiments of the present disclosure. FIG. 7 illustrates a partially enlarged view of a region "C" in FIG. 6. The package structure 1*c* of FIG. 6 and FIG. 7 is similar to the package structure 1*a* of FIG. 2 and FIG. 3, and the differences therebetween may be described as follows.

The first encapsulation layer 51 (e.g., the molding layer) of the encapsulant 5 may define a plurality of openings 57 instead of the projections 56 of FIG. FIG. 3. The openings 57 may be recessed from the first top surface 511 of the first encapsulation layer 51 (e.g., the molding layer) and may be disposed far away from the interconnector 4. The protrusion structure 55 may be closer to the interconnector 4 than the opening 57 is. A size (including, for example, a depth or a width) of one of the plurality of openings 57 may be less than a size (including, for example, a height or a width) of the protrusion structure 55. The size (including, for example, a depth or a width) of one of the plurality of openings 57 may be less than a size (including, for example, a height or a width) of the first recess 513. The openings 57 may be regularly distributed or irregularly distributed. Thus, the roughness of the first surface 53 (e.g., the top surface) of the encapsulant 5 (i.e., the second top surface 521 of the second encapsulation layer 52) may be less than the roughness of the interface between the first encapsulation layer 51 and the second encapsulation layer 52 (i.e., the first top surface 511 of the first encapsulation layer 51). The openings 57 are formed to increase the roughness so as to improve the adhesion or attachment between the first encapsulation layer 51 (e.g., the molding layer) and the second encapsulation layer 52 (e.g., the dielectric layer).

Figure 8:
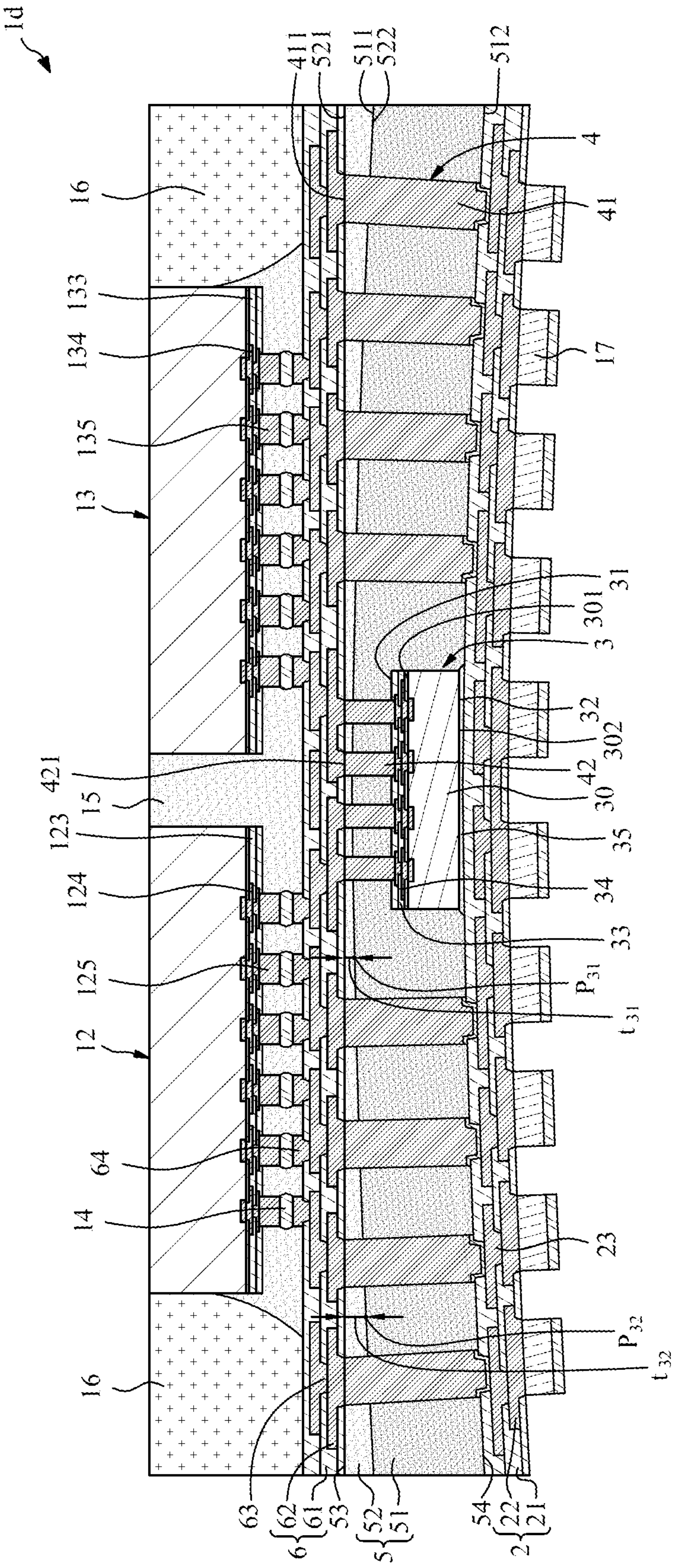
FIG. 8 illustrates a cross-sectional view of a package structure according to some embodiments of the present disclosure.

FIG. 8 illustrates a cross-sectional view of a package structure 1*d* according to some embodiments of the present disclosure. The package structure 1*d* of FIG. 8 is similar to the package structure 1 of FIG. 1, and the differences therebetween may be described as follows.

The second patterned circuit structure 2 and the encapsulant 5 (including the first encapsulation layer 51 and the second encapsulation layer 52 may have a warpage, such as a convex warpage. When a grinding process is performed on the first surface 53 (e.g., the top surface) of the warped encapsulant 5 (i.e., the second top surface 521 of the warped second encapsulation layer 52), the closer to the center of the encapsulant 5 (or the first electronic device 3), the more second encapsulation layer 52 may be removed.

After the grinding process, the second top surface 521 of the second encapsulation layer 52 may be non-parallel with the second bottom surface 522 of the second encapsulation layer 52. A thickness of the second encapsulation layer 52 may reduce gradually toward a position corresponding to the center of the encapsulant 5 (or the first electronic device 3). The second encapsulation layer 52 (e.g., the dielectric layer) of the encapsulant 5 may have a non-consistent thickness.

For example, the second encapsulation layer 52 (e.g., the dielectric layer) of the encapsulant 5 may have a first point $P_{31}$ and a second point $P_{32}$. The first point $P_{31}$ is closer to the center of the encapsulant 5 (or the first electronic device 3) than the second point $P_{32}$ is. A removal amount of the second encapsulation layer 52 (e.g., the dielectric layer) corresponding to the first point $P_{31}$ is greater than a removal amount of the second encapsulation layer 52 (e.g., the dielectric layer) corresponding to the second point $P_{32}$. Thus, a first thickness $t_{31}$ of the second encapsulation layer 52 (e.g., the dielectric layer) corresponding to the first point $P_{31}$ is less than a second thickness $t_{32}$ of the second encapsulation layer 52 (e.g., the dielectric layer) corresponding to the second point $P_{32}$.

Figure 9:
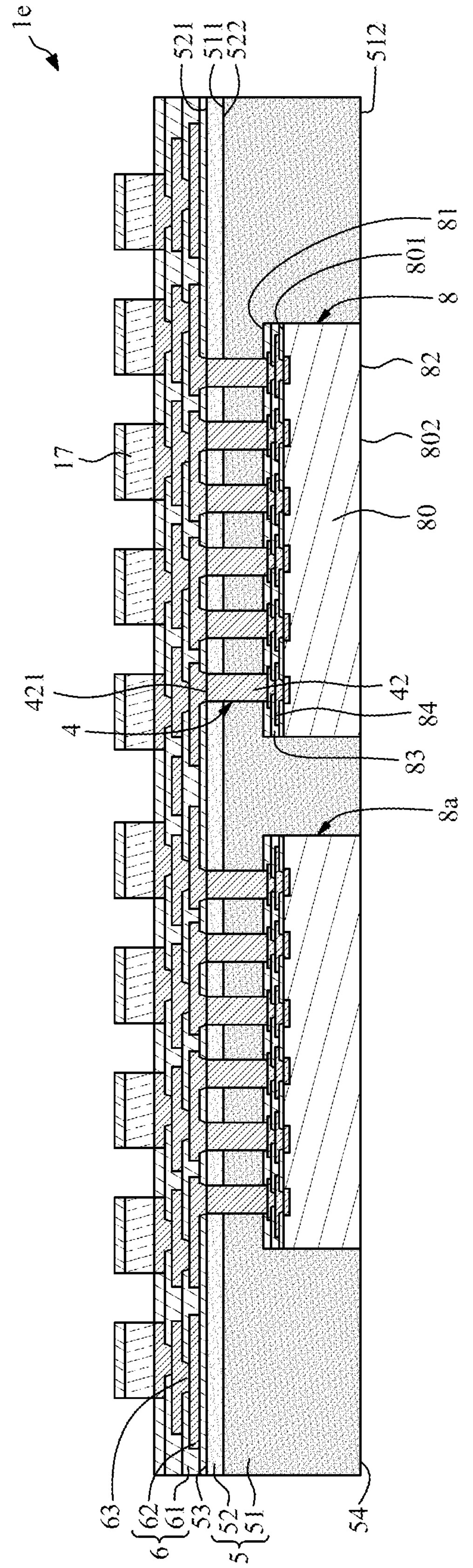
FIG. 9 illustrates a cross-sectional view of a package structure according to some embodiments of the present disclosure.

FIG. 9 illustrates a cross-sectional view of a package structure 1*e* according to some embodiments of the present disclosure. The package structure 1*e* may be an electronic package structure or a semiconductor package structure. The package structure 1*e* may include a first electronic device 8, a second electronic device 8*a*, an interconnector 4 (including, for example, at least one bump 42), an encapsulant 5 (including, for example, a first encapsulation layer 51 and a second encapsulation layer 52), a first patterned circuit structure 6 and at least one external connector 17.

The first electronic device 8 and the second electronic device 8*a* may be disposed side by side. In some embodiments, each of the first electronic device 8 and the second electronic device 8*a* may be a semiconductor die, such as an application specific integrated circuit (ASIC) die. The structure of the second electronic device 8*a* may be same as or similar to the structure of the first electronic device 8. The first electronic device 8 may have a first surface 81 (e.g., a top surface or an active surface) and a second surface 82 (e.g., a bottom surface or a backside surface) opposite to the first surface 81. The first electronic device 8 may include a main body 80, at least one dielectric layer 83 and at least one circuit layer 84. The main body 80 may have a first surface 801 (e.g., a top surface) and a second surface 802 (e.g., a bottom surface) opposite to the first surface 801. The dielectric layer 83 and the circuit layer 84 may be disposed on or disposed over the first surface 801 of the main body 80. The circuit layer 84 may be a patterned circuit layer, and may be embedded in the dielectric layers 83. The circuit layer 84 may be a back end of line (BEOL). The circuit layer 84 of the first electronic device 8 may include at least one inner via tapering downwardly. The second surface 802 (e.g., the bottom surface) of the main body 80 may be the second surface 82 (e.g., the bottom surface) of the first electronic device 8.

The interconnector 4 may include a plurality of bumps 42. The bumps 42 may include a plurality of conductive bumps or a plurality of metal bumps, and may be disposed between the first electronic device 8 and the first patterned circuit structure 6. The bumps 42 may be disposed adjacent to the first surface 81 (e.g., the top surface or the active surface) of the first electronic device 8. For example, the bumps 42 may protrude from the first surface 81 (e.g., the top surface or the active surface) of the first electronic device 8, and may be electrically connected to the circuit layer 84 of the first electronic device 8. Thus, the first patterned circuit structure 6 is electrically connected to the first electronic device 8 through the bumps 42.

The encapsulant 5 of FIG. 9 may be same as or similar to the encapsulant 5 of FIG. 1. The encapsulant 5 may be disposed under the first patterned circuit structure 6, and may encapsulate the first electronic device 8, the second electronic device 8*a* and the interconnector 4 (including, for example, the bumps 42). The encapsulant 5 may have a first surface 53 (e.g., a top surface) and a second surface 54 (e.g., a bottom surface) opposite to the first surface 53. The first surface 53 (e.g., the top surface) of the encapsulant 5 may be substantially coplanar with or co-level with top surfaces of the interconnector 4 (including the top surfaces 421 of the bumps 42). The second surface 54 (e.g., the bottom surface) of the encapsulant 5 may be substantially co-level, co-planar or aligned with the second surface 802 (e.g., the bottom surface) of the main body 80 (i.e., the second surface 82 (e.g., the bottom surface) of the first electronic device 8) and a bottom surface of the second electronic device 8*a*.

The encapsulant 5 may include a first encapsulation layer 51 and a second encapsulation layer 52 disposed on the first encapsulation layer 51. The first encapsulation layer 51 may have a first top surface 511 and a first bottom surface 512 opposite to the first top surface 511. The second encapsulation layer 52 may have a second top surface 521 and a second bottom surface 522 opposite to the second top surface 521. The second encapsulation layer 52 may be formed on and may directly contact the first top surface 511 of the first encapsulation layer 51. The first bottom surface 512 of the first encapsulation layer 51 may be the second surface 54 (e.g., the bottom surface) of the encapsulant 5.

The first encapsulation layer 51 may encapsulate the first electronic device 8 and the second electronic device 8*a*. Thus, the first encapsulation layer 51 may cover and contact the first surface 81 (e.g., the top surface or the active surface) of the first electronic device 8. The second encapsulation layer 52 may not contact the first electronic device 8 and the second electronic device 8*a*. The second encapsulation layer 52 may be spaced apart from the first electronic device 8 and the second electronic device 8*a* through the first encapsulation layer 51.

The bumps 42 of FIG. 9 may be same as or similar to the bumps 42 of FIG. 1. Each of the bumps 42 may have a top surface 421. After the grinding process, the top surface of the interconnector 4 (including, for example, the bumps 42) may be substantially co-level or co-planar with the second top surface 521 of the second encapsulation layer 52.

The first patterned circuit structure 6 of FIG. 9 may be same as or similar to the first patterned circuit structure 6 of FIG. 1. The first patterned circuit structure 6 may be disposed over the second top surface 521 of the second encapsulation layer 52 of the encapsulant 5, and may be electrically connected to the first electronic device 8 and the second electronic device 8*a* through the bumps 42. The first patterned circuit structure 6 may include at least one dielectric layer 61 and at least one circuit layer 62. The circuit layer 62 may be disposed over the second top surface 521 of the second encapsulation layer 52 of the encapsulant 5, and may be electrically connected to the interconnector 4 (including, for example, the bumps 42).

The external connector 17 may be disposed on and electrically connected to the first patterned circuit structure 6 for external connection. In some embodiments, the external connector 17 may include a metal bump or a solder material.

Figure 10:
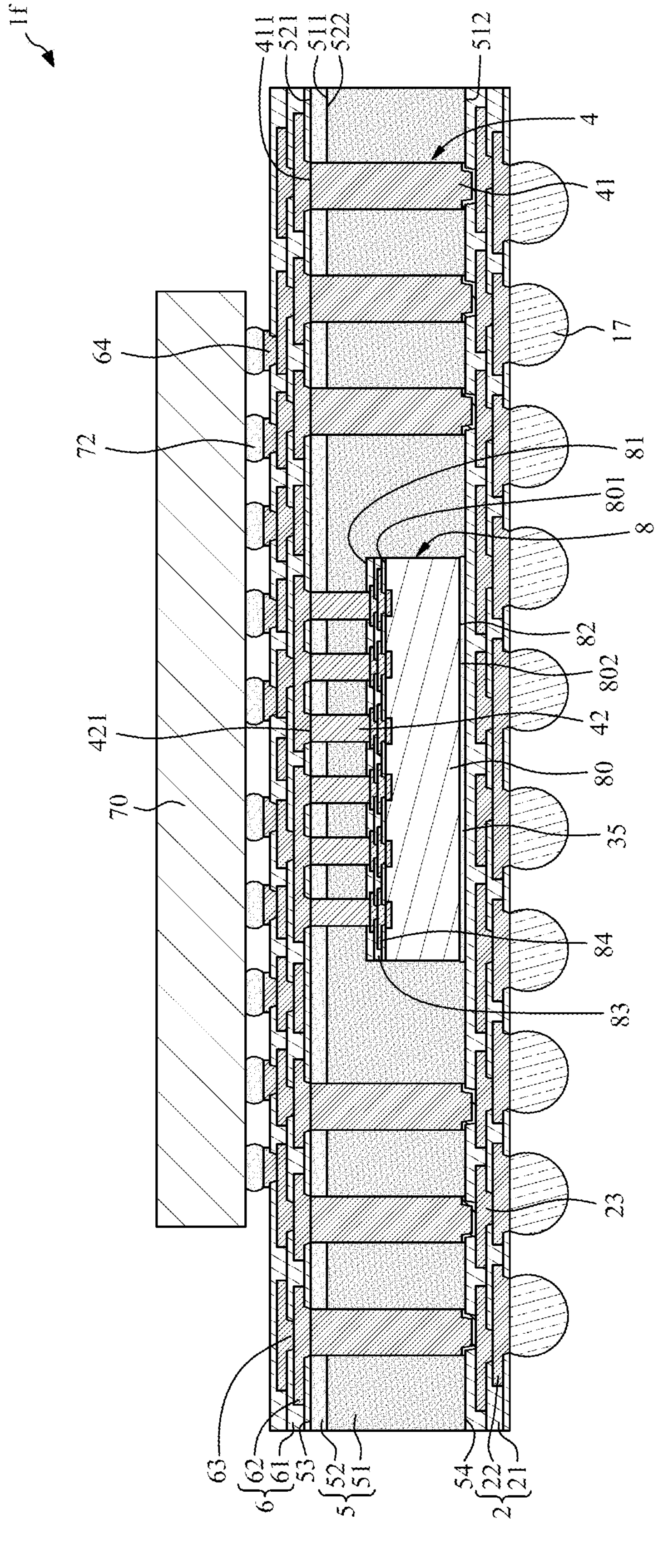
FIG. 10 illustrates a cross-sectional view of a package structure according to some embodiments of the present disclosure.

FIG. 10 illustrates a cross-sectional view of a package structure if according to some embodiments of the present disclosure. The package structure if of FIG. 10 is similar to the package structure 1 of FIG. 1, and the differences therebetween may be described as follows. As shown in FIG. 10, a first electronic device 8 may replace the first electronic device 3 of FIG. 1. The first electronic device 8 of FIG. 10 may be same as or similar to the first electronic device 8 of FIG. 9. In addition, a second electronic device 70 may replace the second electronic device 12 and the third electronic device 13 of FIG. 1, and may be electrically connected to the first patterned circuit structure 6 through the solder materials 72 and the pads 64. Further, the external connector 17 may include a solder ball.

FIG. 11 through FIG. 18 illustrate a method for manufacturing a package structure according to some embodiments of the present disclosure. In some embodiments, the method is for manufacturing the package structure 1*a* shown in FIG. 2.

Figure 11:
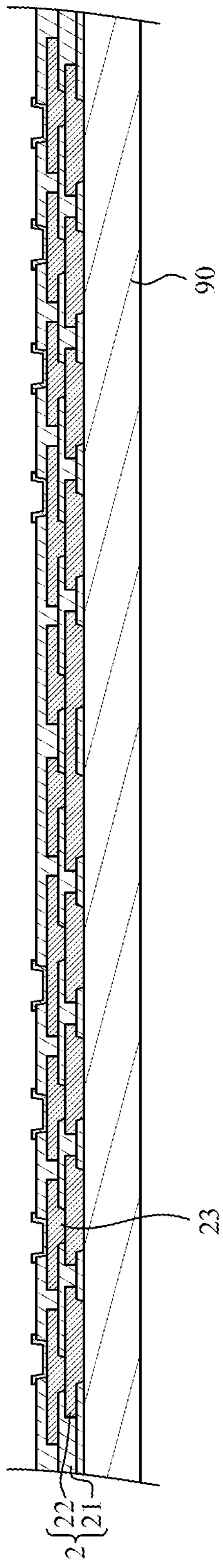
FIG. 11 illustrates one or more stages of an example of a method for manufacturing a package structure according to some embodiments of the present disclosure.

Referring to FIG. 11, a carrier 90 may be provided, and a second patterned circuit structure 2 may be formed or disposed on the carrier 90. The second patterned circuit structure 2 of FIG. 11 may be same as or similar to the second patterned circuit structure 2 of FIG. 2.

Figure 12:
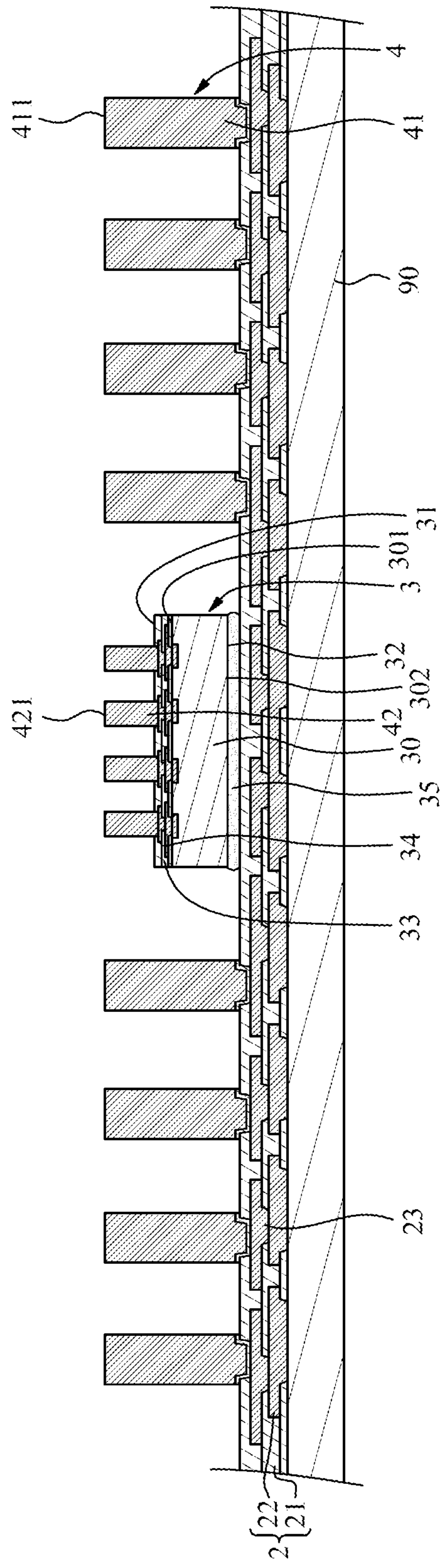
FIG. 12 illustrates one or more stages of an example of a method for manufacturing a package structure according to some embodiments of the present disclosure.

Referring to FIG. 12, a plurality of pillars 41 may be formed or disposed on the second patterned circuit structure 2, and is electrically connected to the second patterned circuit structure 2. For example, the pillars 41 may be formed by plating. Then, a first electronic device 3 may be adhered to or attached to the second patterned circuit structure 2. In some embodiments, the first electronic device 3 of FIG. 12 may be similar to or same as the first electronic device 3 of FIG. 2. The first electronic device 3 may include a plurality of bumps 42. In some embodiments, the pillars 41 and the bumps 42 may be collectively defined as an interconnector 4.

Figure 13:
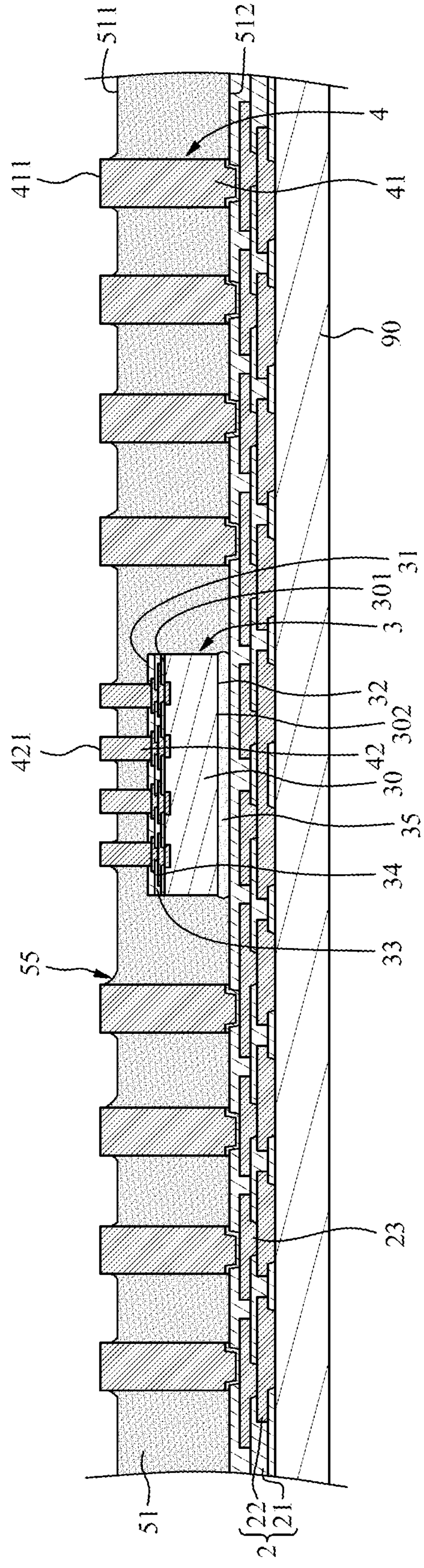
FIG. 13 illustrates one or more stages of an example of a method for manufacturing a package structure according to some embodiments of the present disclosure.

Referring to FIG. 13, a first encapsulation layer 51 (e.g., the molding layer) may be formed on the second patterned circuit structure 2 to encapsulate the first electronic device 3, the bumps 42 and the pillars 41 through a molding process. The first encapsulation layer 51 (e.g., the molding layer) of FIG. 13 may be same as or similar to the first encapsulation layer 51 (e.g., the molding layer) of FIG. 2. The bumps 42 and the pillars 41 may protrude from the first encapsulation layer 51 (e.g., the molding layer), and the protrusion structure 55 (FIG. 3) may be formed to surround or may be disposed around the interconnector 4 (including the bumps 42 and the pillars 41).

Figure 14:
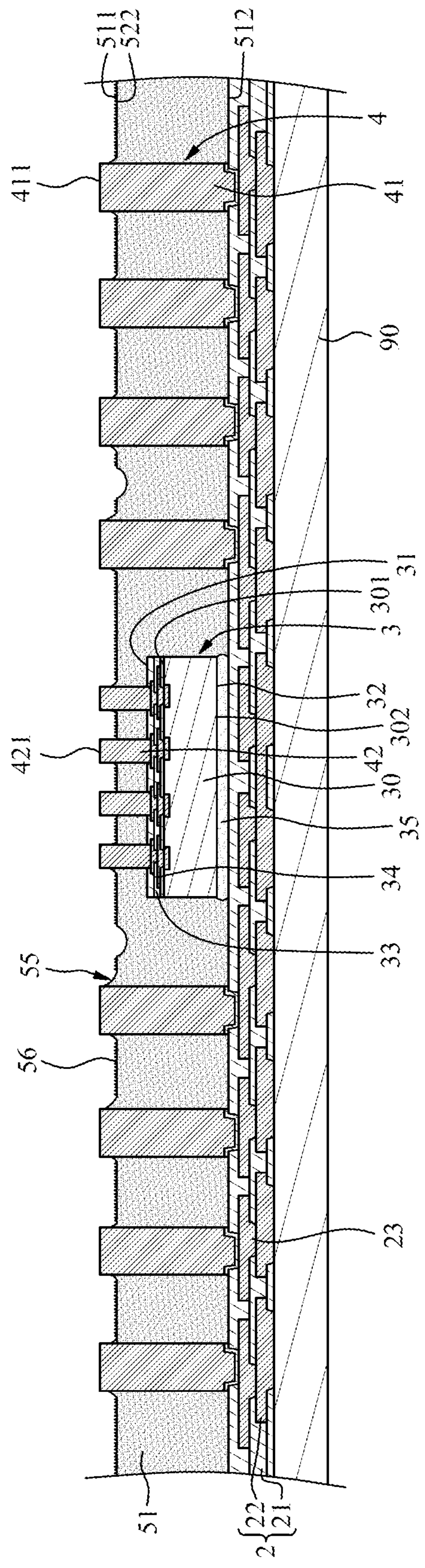
FIG. 14 illustrates one or more stages of an example of a method for manufacturing a package structure according to some embodiments of the present disclosure.

Referring to FIG. 14, a plurality of projections 56 may be formed on the first top surface 511 of the first encapsulation layer 51 so as to rough the first top surface 511 of the first encapsulation layer 51.

Figure 15:
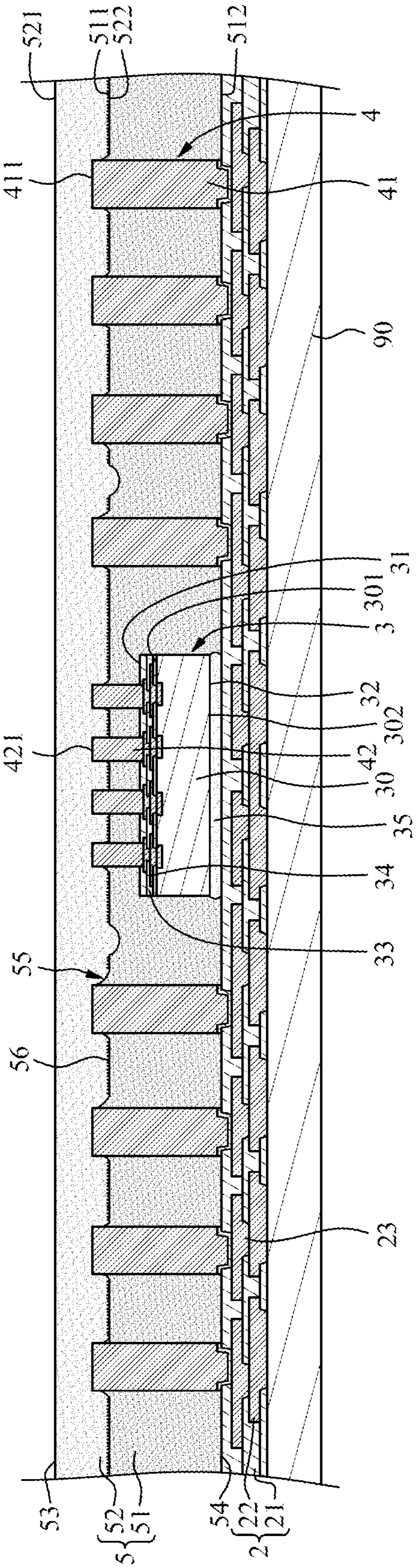
FIG. 15 illustrates one or more stages of an example of a method for manufacturing a package structure according to some embodiments of the present disclosure.

Referring to FIG. 15, a second encapsulation layer 52 (e.g., the dielectric layer) may be formed on the first top surface 511 of the first encapsulation layer 51 so as to cover the interconnector 4 (including the bumps 42 and the pillars 41). The second encapsulation layer 52 (e.g., the dielectric layer) of FIG. 15 may be same as or similar to the second encapsulation layer 52 (e.g., the dielectric layer) of FIG. 2. The second encapsulation layer 52 (e.g., the dielectric layer) and the first encapsulation layer 51 (e.g., the molding layer) may be collectively defined as an encapsulant 5.

Figure 16:
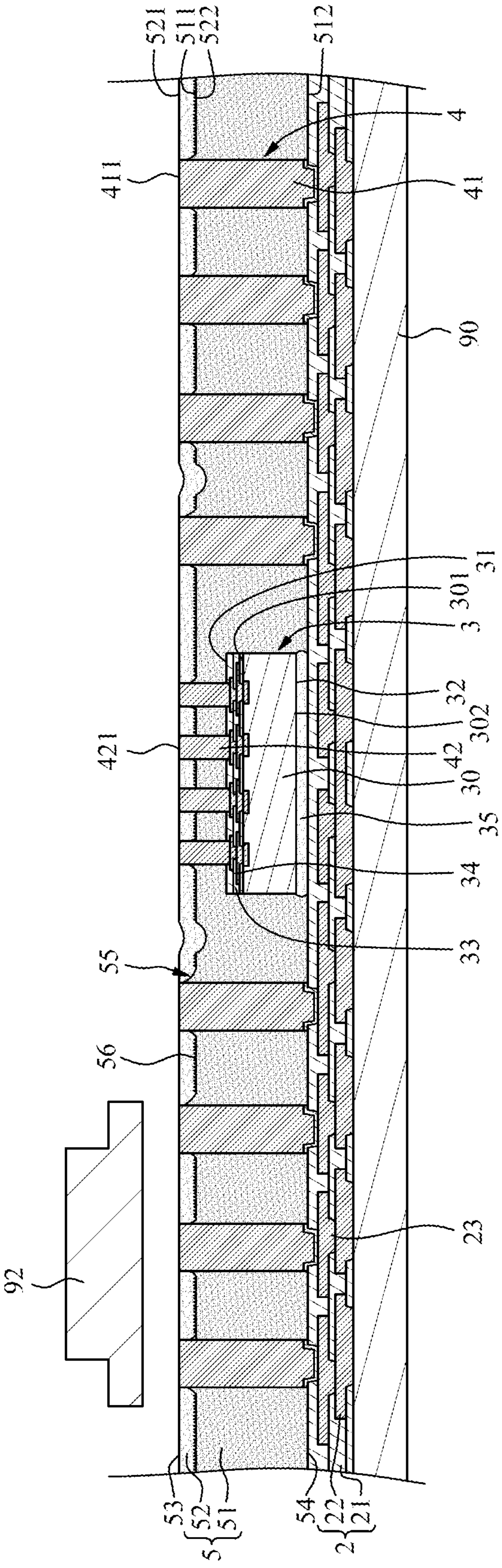
FIG. 16 illustrates one or more stages of an example of a method for manufacturing a package structure according to some embodiments of the present disclosure.

Referring to FIG. 16, a grinding process may be performed on a second top surface 521 of the second encapsulation layer 52 through a grinding tool 92. Thus, the top surfaces 411 of the pillars 41 and the top surfaces 421 of the bumps 42 may be substantially co-level with, co-planar with or aligned with the second top surface 521 of the second encapsulation layer 52. During the grinding process, only the second encapsulation layer 52 may be ground by the grinding tool 92. Thus, the second encapsulation layer 52 may prevent the first encapsulation layer 51 from being ground during the grinding process. The second encapsulation layer 52 may prevent the first fillers 514 (FIG. 3) of the first encapsulation layer 51 from being removed during the grinding process so as to prevent any void or opening from forming on the first top surface 511 of the first encapsulation layer 51 or on the first surface 53 (e.g., the top surface) of the encapsulant 5.

Figure 17:
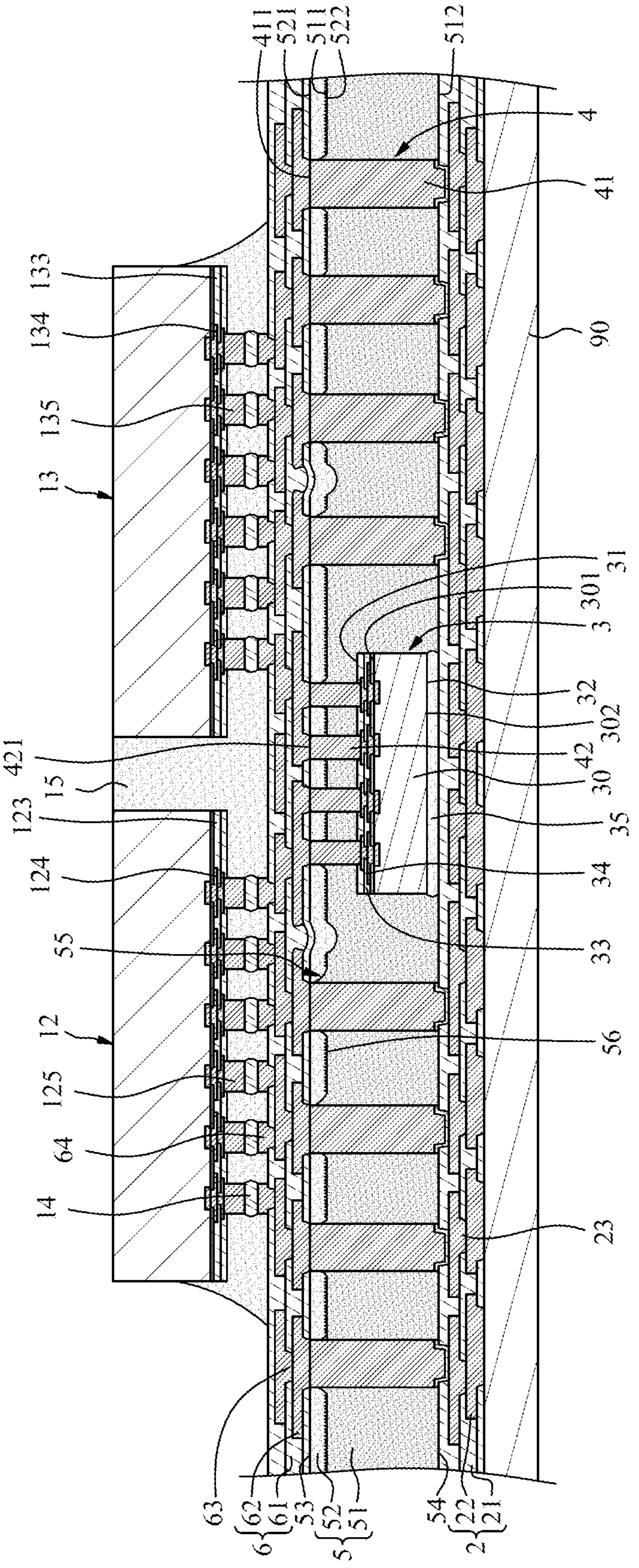
FIG. 17 illustrates one or more stages of an example of a method for manufacturing a package structure according to some embodiments of the present disclosure.

Referring to FIG. 17, a first patterned circuit structure 6 may be formed on the second encapsulation layer 52 of the encapsulant 5 to electrically connect the first electronic device 3 and the pillars 41. Then, a second electronic device 12 and a third electronic device 13 may be disposed on the first patterned circuit structure 6. The second electronic device 12 and the third electronic device 13 may be electrically connected to the first patterned circuit structure 6 through a plurality of solder materials 14. Then, an underfill 15 may be formed or disposed between the first patterned circuit structure 6, the second electronic device 12 and the third electronic device 13, and may cover the solder materials 14.

Figure 18:
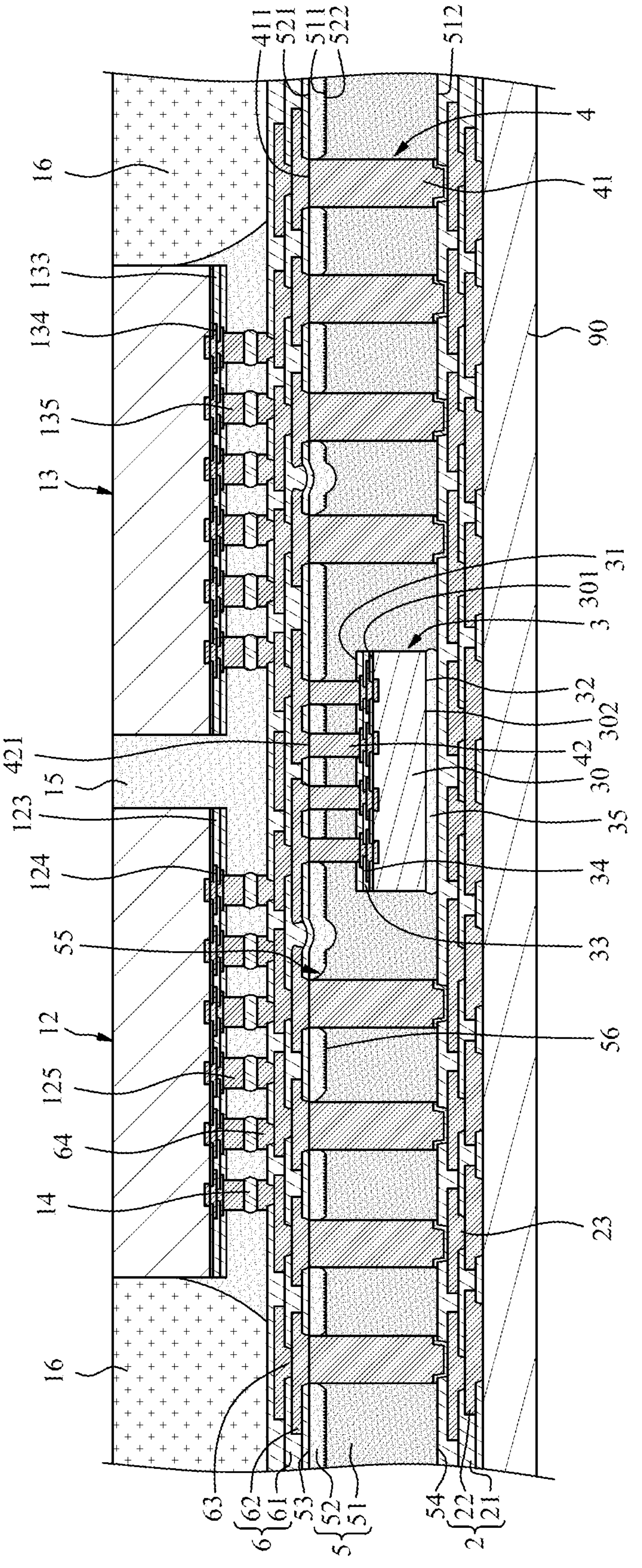
FIG. 18 illustrates one or more stages of an example of a method for manufacturing a package structure according to some embodiments of the present disclosure.

Referring to FIG. 18, a protection material 16 may be formed on the first patterned circuit structure 6 to encapsulate the second electronic device 12 and the third electronic device 13. Then, the carrier 90 may be removed to expose the second patterned circuit structure 2. At least one external connector 17 may be disposed on and electrically connected to the second patterned circuit structure 2. Then, a singulation process may be conducted to form the package structure 1*a* as shown in FIG. 2.

Spatial descriptions, such as “above,” “below,” “up,” “left,” “right,” “down,” “top,” “bottom,” “vertical,” “horizontal,” “side,” “higher,” “lower,” “upper,” “over,” “under,” and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms “approximately,” “substantially,” “substantial” and “about” are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be “substantially” the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, “substantially” perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms “a,” “an,” and “the” may include plural referents unless the context clearly dictates otherwise.

As used herein, the terms “conductive,” “electrically conductive” and “electrical conductivity” refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:

an interconnector including a lower portion and an upper portion located on the lower portion;

a first encapsulation layer encapsulating the lower portion, and having a first top surface adjacent to the upper portion, wherein the first top surface includes a first region and a second region different from the first region; and a second encapsulation layer encapsulating the upper portion, and having a second bottom surface facing the first top surface and a second top surface opposite to the second bottom surface, wherein the second top surface includes a third region and a fourth region different from the third region, wherein a first elevation difference between a first elevation of the first region and a second elevation of the second region is greater than a second elevation difference between a third elevation of the third region and a fourth elevation of the fourth region.

2. The package structure of claim 1, wherein the second encapsulation layer is free of fillers.

3. The package structure of claim 2, wherein the second top surface is substantially co-level with a top surface of the interconnector.

4. The package structure of claim 2, further comprising a patterned circuit structure disposed over the second encapsulation layer and spaced apart from the first encapsulation layer, wherein an interface between an inner via of the patterned circuit structure and the interconnector is substantially co-level with the second top surface.

5. The package structure of claim 1, wherein the first top surface is smoother than the second top surface.

6. The package structure of claim 5, wherein the first encapsulation layer includes a plurality of fillers, wherein the plurality of fillers are not exposed by the first top surface.

7. The package structure of claim 1, wherein the interconnector extends through an interface between the first encapsulation layer and the second encapsulation layer.

8. The package structure of claim 1, wherein the first top surface includes a fifth region extending toward the upper portion of the interconnector.

9. The package structure of claim 8, wherein the second encapsulation layer includes a second lower portion laterally overlapping the fifth region and a second upper portion free from laterally overlapping the fifth region.

10. The package structure of claim 8, wherein the first top surface of the first encapsulation layer includes a recess, and the second encapsulation layer includes a plurality of fillers disposed in the recess.

11. A package structure, comprising:

an interconnector;

a first encapsulation layer encapsulating the interconnector, having a first top surface, and including a first filler; and a second encapsulation layer encapsulating the interconnector, disposed over the first encapsulation layer, and having a second bottom surface facing the first top surface and a second top surface opposite to the second bottom surface, wherein the second encapsulation layer includes a second filler, wherein a diameter of the second filler is less than a diameter of the first filler;

wherein an elevation of the second top surface is higher than an elevation of the first top surface, and a top surface of the interconnector is substantially aligned with the second top surface.

12. The package structure of claim 11, wherein the second top surface is flatter than the second bottom surface.

13. The package structure of claim 12, wherein a thickness of the second encapsulation layer decreases toward the interconnector.

14. The package structure of claim 11, further comprising a patterned circuit structure disposed over the second encapsulation layer, wherein the patterned circuit structure includes a trace and a via connecting the trace, and a thickness of the trace is greater than a diameter of the second filler.

15. The package structure of claim 14, wherein the second top surface includes a recess, and the trace is disposed over the recess and is conformal with the recess.

16. A package structure, comprising:

a pillar; and a first encapsulation layer including a plurality of fillers, encapsulating the pillar, and having a first top surface, wherein the pillar includes a first portion extending beyond the first top surface of the first encapsulation layer and a second portion embedded in the first encapsulation layer, wherein the plurality of fillers are not exposed by the first top surface;

wherein the pillar has a top surface higher than the first top surface.

17. The package structure of claim 16, wherein a thickness of the first portion of the pillar is less than a thickness of the second portion of the pillar.

18. The package structure of claim 17, further comprising a second encapsulation layer encapsulating the first portion of the pillar, wherein a free shrinkage ratio of the second encapsulation layer is greater than a free shrinkage ratio of the first encapsulation layer.

19. The package structure of claim 18, wherein the top surface of the pillar is exposed by a second top surface of the second encapsulation layer, and the top surface of the pillar is substantially aligned with the second top surface of the second encapsulation layer.

20. The package structure of claim 16, wherein the first encapsulation layer includes a first portion adjacent to the pillar and a second portion far away from the pillar along a horizontal direction, and a thickness of the first portion of the first encapsulation layer is greater than a thickness of the second portion of the first encapsulation layer.

* * * * *